United States Patent
Tran

(10) Patent No.: US 8,043,915 B2
(45) Date of Patent: Oct. 25, 2011

(54) PITCH MULTIPLIED MASK PATTERNS FOR ISOLATED FEATURES

(75) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/813,157

(22) Filed: Jun. 10, 2010

(65) Prior Publication Data
US 2010/0243161 A1  Sep. 30, 2010

Related U.S. Application Data

(62) Division of application No. 11/219,067, filed on Sep. 1, 2005, now Pat. No. 7,759,197.

(51) Int. Cl.
*H01L 21/84* (2006.01)
(52) U.S. Cl. ........ 438/267; 438/157; 257/E21.205; 257/E21.626
(58) Field of Classification Search .......... None
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,570,325 A | 2/1986 | Higuchi | |
| 4,648,937 A | 3/1987 | Ogura et al. | |
| 4,716,131 A | 12/1987 | Okazawa et al. | |
| 4,776,922 A | 10/1988 | Bhattacharyya et al. | |
| 4,838,991 A | 6/1989 | Cote et al. | |
| 5,013,680 A | 5/1991 | Lowrey et al. | |
| 5,047,117 A | 9/1991 | Roberts | |

(Continued)

FOREIGN PATENT DOCUMENTS
DE   280851   7/1990
(Continued)

OTHER PUBLICATIONS

Bergeron, et al. "Resolution Enhancement Techniques for the 90nm Technology Node and Beyond," Future Fab International, Issue 15, Jul. 11, 2003, 4 pages.

(Continued)

*Primary Examiner* — Zandra Smith
*Assistant Examiner* — Pamela E Perkins
(74) *Attorney, Agent, or Firm* — Knobbe, Martens, Olson & Bear LLP

(57) ABSTRACT

Crisscrossing spacers formed by pitch multiplication are used as a mask to form isolated features, such as contacts vias. A first plurality of mandrels are formed on a first level and a first plurality of spacers are formed around each of the mandrels. A second plurality of mandrels is formed on a second level above the first level. The second plurality of mandrels is formed so that they cross, e.g., are orthogonal to, the first plurality of mandrels, when viewed in a top down view. A second plurality of spacers is formed around each of the second plurality of mandrels. The first and the second mandrels are selectively removed to leave a pattern of voids defined by the crisscrossing first and second pluralities of spacers. These spacers can be used as a mask to transfer the pattern of voids to a substrate. The voids can be filled with material, e.g., conductive material, to form conductive contacts.

25 Claims, 38 Drawing Sheets

U.S. PATENT DOCUMENTS

| | | |
|---|---|---|
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,593,813 A | 1/1997 | Kim |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,042,998 A | 3/2000 | Brueck et al. |
| 6,057,573 A | 5/2000 | Kirsch et al. |
| 6,060,383 A | 5/2000 | Nogami et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,372,649 B1 | 4/2002 | Han et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,475,867 B1 | 11/2002 | Hui et al. |
| 6,500,756 B1 | 12/2002 | Bell et al. |
| 6,514,884 B2 | 2/2003 | Maeda |
| 6,522,584 B1 | 2/2003 | Chen et al. |
| 6,531,067 B1 | 3/2003 | Shiokawa et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,730,571 B1 | 5/2004 | Chan et al. |
| 6,734,107 B2 | 5/2004 | Lai et al. |
| 6,744,094 B2 | 6/2004 | Forbes |
| 6,773,998 B1 | 8/2004 | Fisher et al. |
| 6,794,699 B2 | 9/2004 | Bissey et al. |
| 6,800,930 B2 | 10/2004 | Jackson et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,916,594 B2 | 7/2005 | Bok |
| 6,924,191 B2 | 8/2005 | Liu et al. |
| 6,955,961 B1 | 10/2005 | Chung |
| 6,962,867 B2 | 11/2005 | Jackson et al. |
| 7,015,124 B1 | 3/2006 | Fisher et al. |
| 7,074,668 B1 | 7/2006 | Park et al. |
| 7,115,525 B2 * | 10/2006 | Abatchev et al. ............ 438/725 |
| 7,183,205 B2 | 2/2007 | Hong |
| 7,183,597 B2 | 2/2007 | Doyle |
| 7,202,174 B1 | 4/2007 | Jung |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,442,976 B2 | 10/2008 | Juengling |
| 7,537,866 B2 | 5/2009 | Liu |
| 7,851,135 B2 | 12/2010 | Jung |
| 2001/0005631 A1 | 6/2001 | Kim et al. |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura et al. |
| 2003/0006410 A1 | 1/2003 | Doyle |
| 2003/0044722 A1 | 3/2003 | Hsu et al. |
| 2003/0090002 A1 | 5/2003 | Sugawara et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0087892 A1 | 4/2005 | Hsu et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0164454 A1 | 7/2005 | Leslie |
| 2005/0167394 A1 | 8/2005 | Liu et al. |
| 2005/0186705 A1 | 8/2005 | Jackson et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |
| 2007/0148984 A1 | 6/2007 | Abatchev et al. |
| 2007/0200178 A1 | 8/2007 | Yun et al. |
| 2007/0210449 A1 | 9/2007 | Caspary et al. |
| 2007/0215874 A1 | 9/2007 | Furukawa et al. |
| 2007/0215960 A1 | 9/2007 | Zhu et al. |

| | | | |
|---|---|---|---|
| 2007/0275309 | A1 | 11/2007 | Liu |
| 2008/0054350 | A1 | 3/2008 | Breitwisch et al. |
| 2008/0292991 | A1 | 11/2008 | Wallow |

FOREIGN PATENT DOCUMENTS

| | | |
|---|---|---|
| DE | 42 36 609 A1 | 5/1994 |
| EP | 0 227 303 A2 | 7/1987 |
| EP | 0 491 408 A2 | 6/1992 |
| EP | 1 357 433 A2 | 10/2003 |
| JP | 57-048237 | 3/1982 |
| JP | 05-343370 | 12/1993 |
| JP | H08-55908 | 2/1996 |
| JP | H08-55920 | 2/1996 |
| JP | 2004-152784 | 5/2004 |
| KR | 10-1999-0001440 | 1/1999 |
| KR | 10-1999-027887 | 4/1999 |
| TW | 376582 | 12/1999 |
| WO | WO 94/15261 | 7/1994 |
| WO | WO 02/099864 A1 | 12/2002 |
| WO | WO 2004/001799 A2 | 12/2003 |
| WO | WO 2004/003977 | 1/2004 |
| WO | WO 2005/010973 | 2/2005 |
| WO | WO 2005/034215 A1 | 4/2005 |
| WO | WO 2006/026699 A2 | 3/2006 |

OTHER PUBLICATIONS

Bhave et al. "Developer-soluble Gap fill materials for patterning metal trenches in Via-first Dual Damascene process," preprint of Proceedings of SPIE: Advances in Resist Technology and Processing XXI, vol. 5376, 2004, John L. Sturtevant, editor, 8 pages.

Bruek, "Optical and Interferometric Lithography—Nanotechnology Enablers," 2005, Proceedings of the IEEE, vol. 93, No. 10, pp. 1704-1721.

Choi et al. "Sublithographic nanofabrication technology for nanocatalysts and DNA chips," *J. Vac. Sci. Technol.*, Nov./Dec. 2003; pp. 2951-2955.

Chung et al. "Nanoscale Multi-Line Patterning Using Sidewall Structure," Jpn., J. App.. Phys. vol. 41 (2002) Pt. 1, No. 6B, pp. 4410-4414.

Chung et al. "Pattern multiplication method and the uniformity of nanoscale multiple lines," J.Vac.Sci.Technol. B21(4), Jul./Aug. 2003, pp. 1491-1495.

U.S. Appl. No. 11/543,515; filed Oct. 24, 2006, MICRON Ref. No. 2005-1173.00/US.

Ex parte Cantell, unpublished decision of the Board of Patent Appeals and Interferences, Mar. 4, 2005.

Joubert et al. "Nanometer scale linewidth control during etching of polysilicon gates in high-density plasmas," Microelectronic Engineering 69 (2003), pp. 350-357.

Oehrlein et al. "Pattern transfer into low dielectric materials by high-density plasma etching," Solid State Tech., May 2000, 8 pages.

Sheats et al., "Microlithography: Science and Technology," 1998, Marcel Dekkar, Inc., pp. 104-105.

U.S. Office Action issued Jul. 11, 2008 in U.S. Appl. No. 11/367,020, filed Mar. 2, 2006.

U.S. Office Action issued Jun. 2, 2008 in U.S. Appl. No. 11/219,067, filed Sep. 1, 2005.

U.S. Office Action issued Jun. 5, 2008 in U.S. Appl. No. 11/514,117, filed Aug. 30, 2006.

* cited by examiner

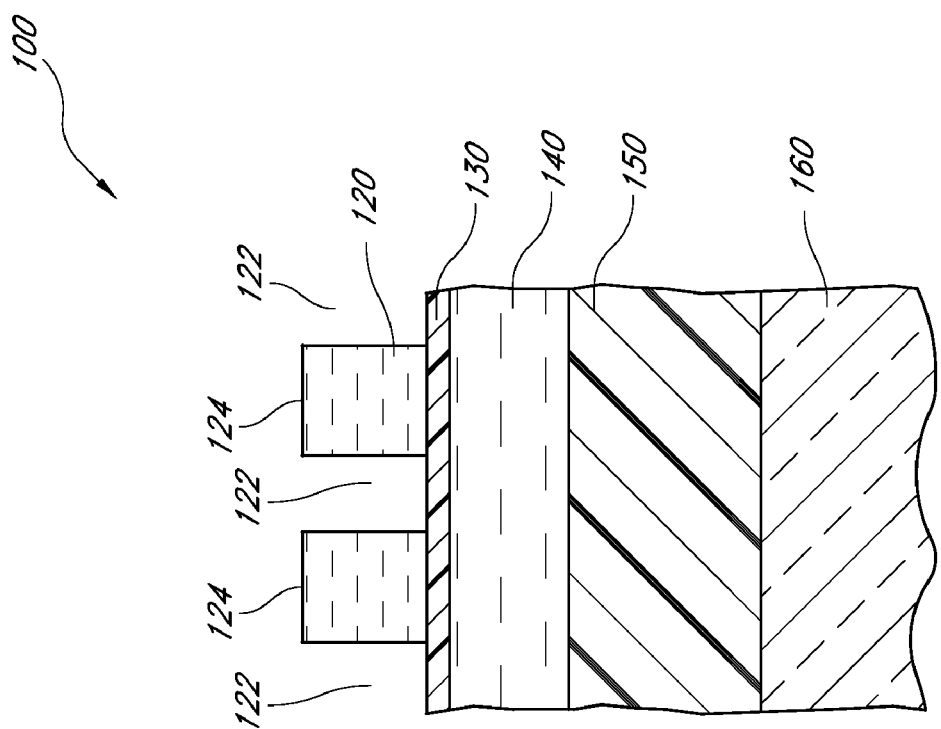

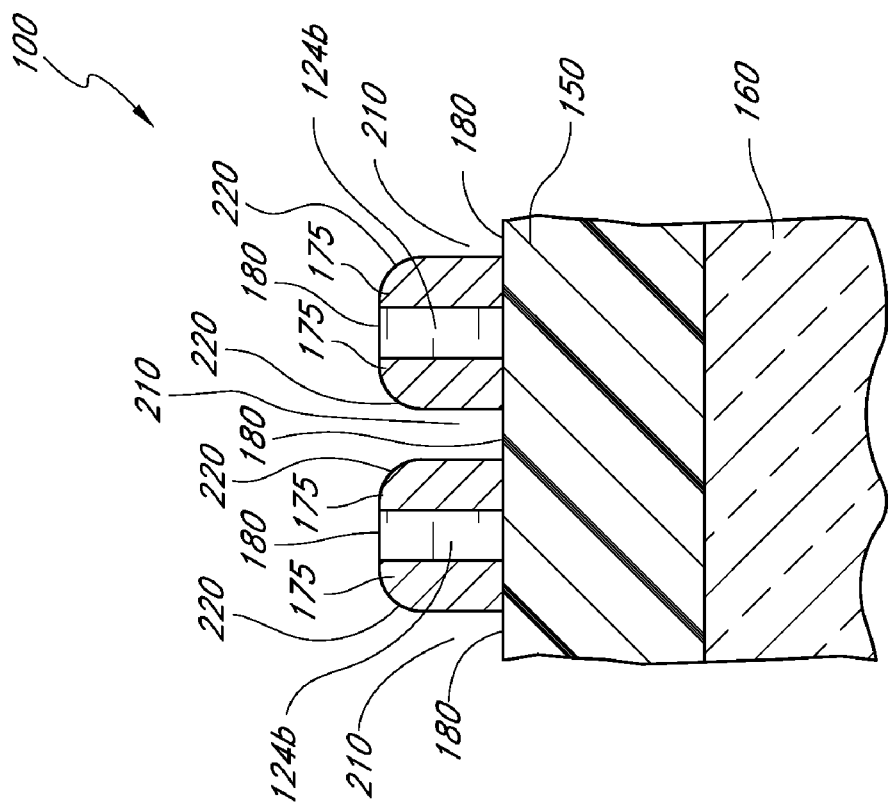

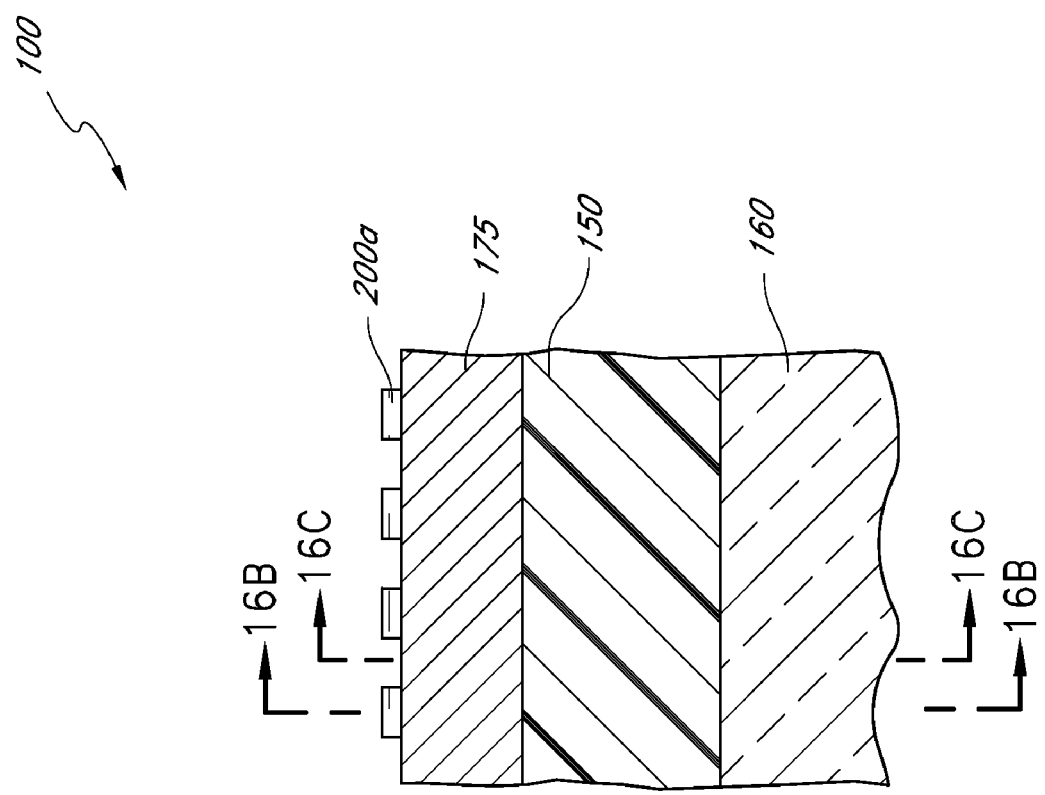

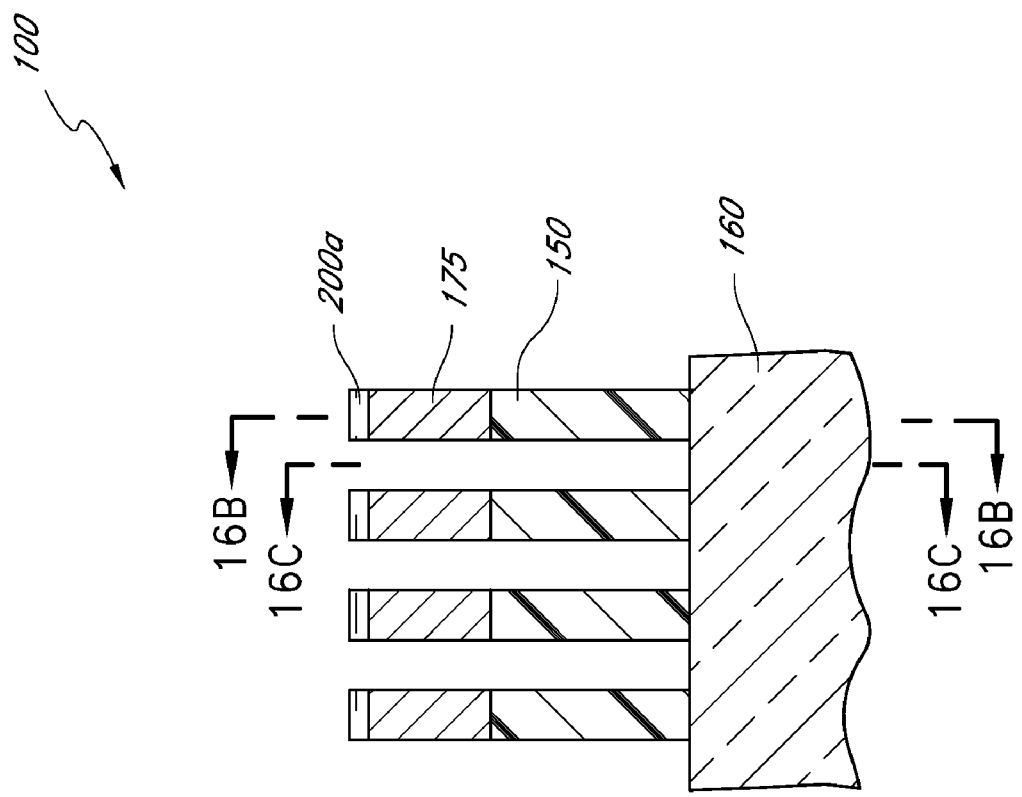

PITCH MULTIPLIED MASK PATTERNS FOR ISOLATED FEATURES

CROSS-REFERENCE TO RELATED APPLICATIONS

This application is a divisional of U.S. Ser. No. 11/219,067, filed Sep. 1, 2005.

In addition, this application is related to, and incorporates by reference in their entireties, the following: U.S. patent application Ser. No. 10/934,778 to Abatchev et al., filed Sep. 2, 2004; U.S. patent application Ser. No. 10/931,771 to Tran et al., filed Aug. 31, 2004; U.S. Provisional Patent Application No. 60/662,323 to Tran et al., filed Mar. 15, 2005; U.S. patent application Ser. No. 11/134,982 to Abatchev et al., filed May 23, 2005; and U.S. patent application Ser. No. 11/215,982 to Luan C. Tran, filed Sep. 1, 2005, entitled Reduced Pitch Contacts, (Micron Ref. No. 2004-1065.00/US).

BACKGROUND OF THE INVENTION

1. Field of the Invention

This invention relates generally to integrated circuit fabrication and, more particularly, to masking techniques.

2. Description of the Related Art

As a consequence of many factors, including demand for increased portability, computing power, memory capacity and energy efficiency, integrated circuits are continuously being made more dense. The sizes of the constituent features that form the integrated circuits, e.g., electrical devices and interconnect lines, are constantly being decreased to facilitate this scaling.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically comprises millions of identical circuit elements, known as memory cells. In general, a capacitor-based memory cell, such as in conventional DRAM, typically consists of two electrical devices: a storage capacitor and an access field effect transistor. Each memory cell is an addressable location that can store one bit (binary digit) of data. A bit can be written to a cell through the transistor and can be read by sensing charge in the capacitor. Some memory technologies employ elements that can act as both a storage device and a switch (e.g., dendritic memory employing silver-doped chalcogenide glass) and some nonvolatile memories do not require switches for each cell (e.g., magnetoresistive RAM). In addition, in some technologies, some elements can act as both charge storage and charge sensing devices. For example, this is the case with flash memory, thus, allowing this type of memory to have one of the smallest cell sizes ($4F^2$) of all memory technologies. In general, by decreasing the sizes of the electrical devices that constitute a memory cell and the sizes of the conducting lines that access the memory cells, the memory devices can be made smaller. Additionally, storage capacities can be increased by fitting more memory cells on a given area in the memory devices.

The continual reduction in feature sizes places ever greater demands on the techniques used to form the features. For example, photolithography is commonly used to pattern features, such as conductive lines. The concept of pitch can be used to describe the sizes of these features. Pitch is defined as the distance between an identical point in two neighboring features when the pattern includes repeating features, as in arrays. These features are typically defined by spaces between adjacent features, which spaces are typically filled by a material, such as an insulator. As a result, pitch can be viewed as the sum of the width of a feature and of the width of the space on one side of the feature separating that feature from a neighboring feature. However, due to factors such as optics and light or radiation wavelength, photolithography techniques each have a minimum pitch below which a particular photolithographic technique cannot reliably form features. Thus, the minimum pitch of a photolithographic technique is an obstacle to continued feature size reduction.

"Pitch doubling" or "pitch multiplication" is one method for extending the capabilities of photolithographic techniques beyond their minimum pitch. A pitch multiplication method is illustrated in FIGS. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern is then transferred using an etch (preferably an anisotropic etch) to the layer 20, thereby forming placeholders, or mandrels, 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60, i.e., the material extending or originally formed extending from sidewalls of another material, are then formed on the sides of the mandrels 40. The spacer formation is accomplished by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by, e.g., the spacers 60. As a result, the smallest feature size possible with a photolithographic technique is effectively decreased.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

Because a spacer pattern typically follows the outlines of mandrels, pitch multiplication is generally useful for forming regularly spaced linear features, such as conductive lines in a memory array. However, in addition to features which extend linearly over relatively large distances, e.g., conductive lines, integrated circuits contain more isolated features, e.g., conductive contacts. The continuing reduction in the sizes of integrated circuits has provided a continuing demand for reductions in the sizes of these isolated features and for increases in the densities of these features. Micromasking techniques, such as isotropically etching mask features, can reduce feature size but do not allow for a corresponding increase in feature density.

Accordingly, there is a need for methods of reducing the sizes of isolated features, while also allowing increases in the density of these features.

SUMMARY OF THE INVENTION

According to one aspect of the invention, a method is provided for semiconductor fabrication. The method comprises forming a first set of spacers on a first level by pitch multiplication. Spacers of the first set of spacers are elongated substantially in a first direction. A second set of spacers is formed on a second level by pitch multiplication. Spacers of the second set of spacers are elongated substantially in a second direction, which crosses the first direction. The method also comprises selectively etching one or more layers underlying the first and the second set of spacers through a mask defined by the first and the second set of spacers.

According to another aspect of the invention, a method is provided for forming an integrated circuit. The method comprises forming a first plurality of mandrels on a first level above a substrate. A first plurality of spacers is formed on sidewalls of the first plurality of mandrels. A second plurality of mandrels is formed on a second level above the first level. A second plurality of spacers is formed on sidewalls of the second plurality of mandrels. The first and the second plurality of mandrels are subsequently subjected to an anisotropic etch selective for materials forming the first and the second plurality of mandrels relative to materials forming the first and the second plurality of spacers.

According to yet another aspect of the invention, a method is provided for semiconductor processing. The method comprises forming a set of temporary placeholders. A first set of spacers is formed immediately adjacent and contacting the placeholders. The first set of spacers have a sub-lithographic pitch. A second set of spacers is formed above the first set of spacers. The spacers of the second set of spacers have a sub-lithographic pitch and are non-parallel to the first set of spacers. At least a portion of the temporary placeholders are exposed to a directional etch after forming the second set of spacers.

According to another aspect of the invention, a mask pattern overlying a partially fabricated integrated circuit is provided. The mask pattern comprises a first plurality of elongated spacers on a first level and a second plurality of elongated spacers on a second level. Spacers of the first plurality of spacers and spacers of the second plurality of spacers extend at an angle of about 30-90° relative to one another.

BRIEF DESCRIPTION OF THE DRAWINGS

The invention will be better understood from the Detailed Description of the Preferred Embodiments and from the appended drawings, which are meant to illustrate and not to limit certain embodiments of the invention, and wherein:

FIGS. 3A and 3B are schematic cross-sectional side and top plan views of the partially formed integrated circuit of FIGS. 2A and 2B after forming lines in a photoresist layer, in accordance with preferred embodiments of the invention;

FIGS. 9A and 9B are schematic, cross-sectional side and top plan views of the partially formed integrated circuit of FIG. 8 after a spacer etch to define spacers on the first level, in accordance with preferred embodiments of the invention;

FIGS. 16A, 16B, 16C and 16D are schematic, cross-sectional side views

DETAILED DESCRIPTION OF THE PREFERRED EMBODIMENTS

In preferred embodiments of the invention, in a process for reducing feature sizes, pitch-multiplied spacers are formed on multiple levels to define isolated features. The spacers on different levels extend or are elongated substantially in directions or axes that form an angle relative to spacers on other levels, so that the spacers on different levels appear to cross or intersect when viewed in a top down view. Preferably, the angle is about 30°-90°. More preferably, the spacers are formed on two levels and the spacers on a first level are orthogonal to the spacers on a second level. The spacers on each level are preferably formed by pitch multiplication in which mandrels are formed and the spacers are formed on the sides of each of the mandrels. Preferably, a plurality of mandrels is formed on each level, to form a plurality of spacers on each level. Exposed portions of the mandrels between the spacers are preferably removed after formation of the various sets of spacers, thereby forming voids bounded by the various spacers on the various levels. Preferably, the pattern formed by the spacers is transferred to one or more underlying materials, e.g., an oxide to form an array of vias which can later be filled to form individual circuit elements, e.g., contacts or memory storage devices, in an integrated circuit. In other embodiments, the spacers or the material underlying the spacers is removed to define a plurality of standalone, up-right, pillar-like structures for forming various electrical devices, e.g., vertical surround transistors formed by etching the substrate.

Reference will now be made to the Figures, wherein like numerals refer to like parts throughout. It will be appreciated that these Figures are not necessarily drawn to scale.

In a first phase of methods according to the preferred embodiments, spacers are formed on a first level.

Figure 1A:
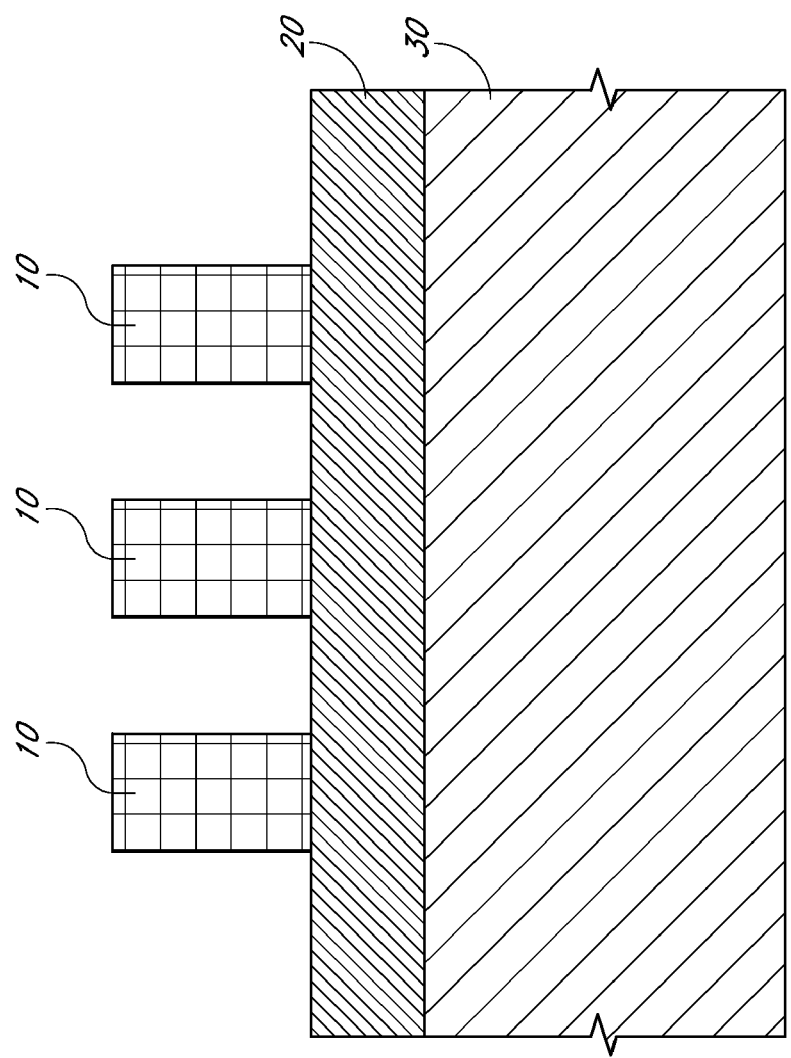
FIGS. 1A-1F are schematic, cross-sectional side views of a sequence of masking patterns for forming conductive lines, in accordance with a prior art pitch doubling method.
Figure 1B:
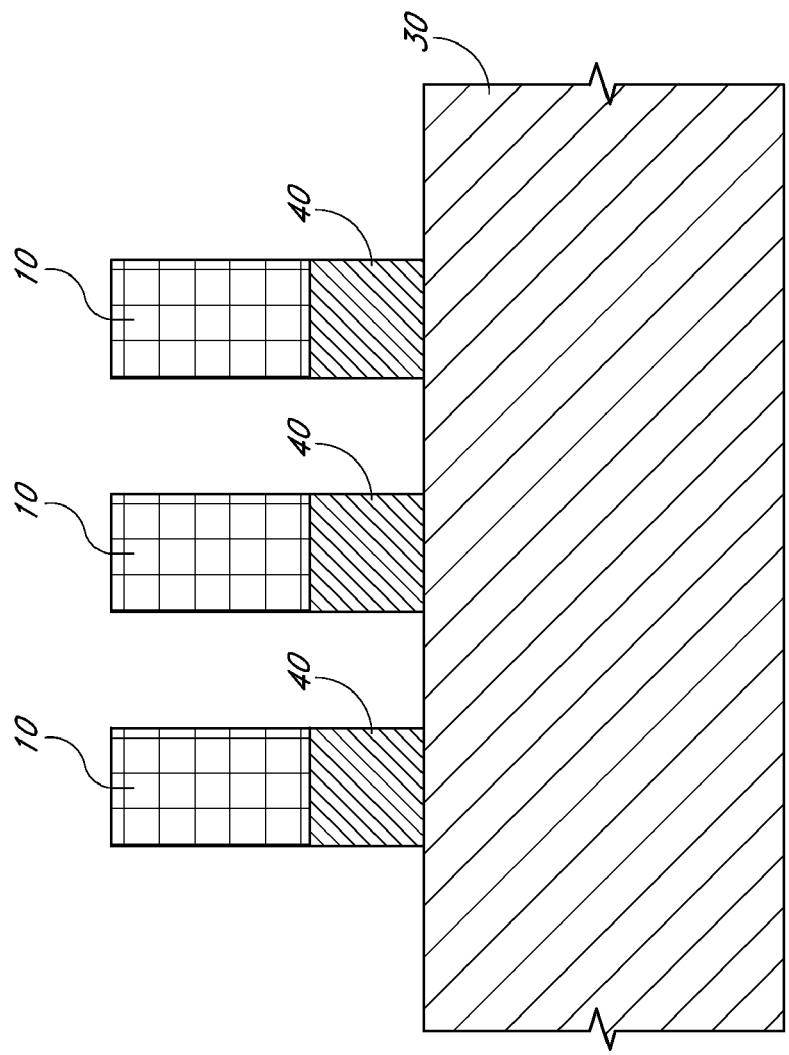
Figure 1C:
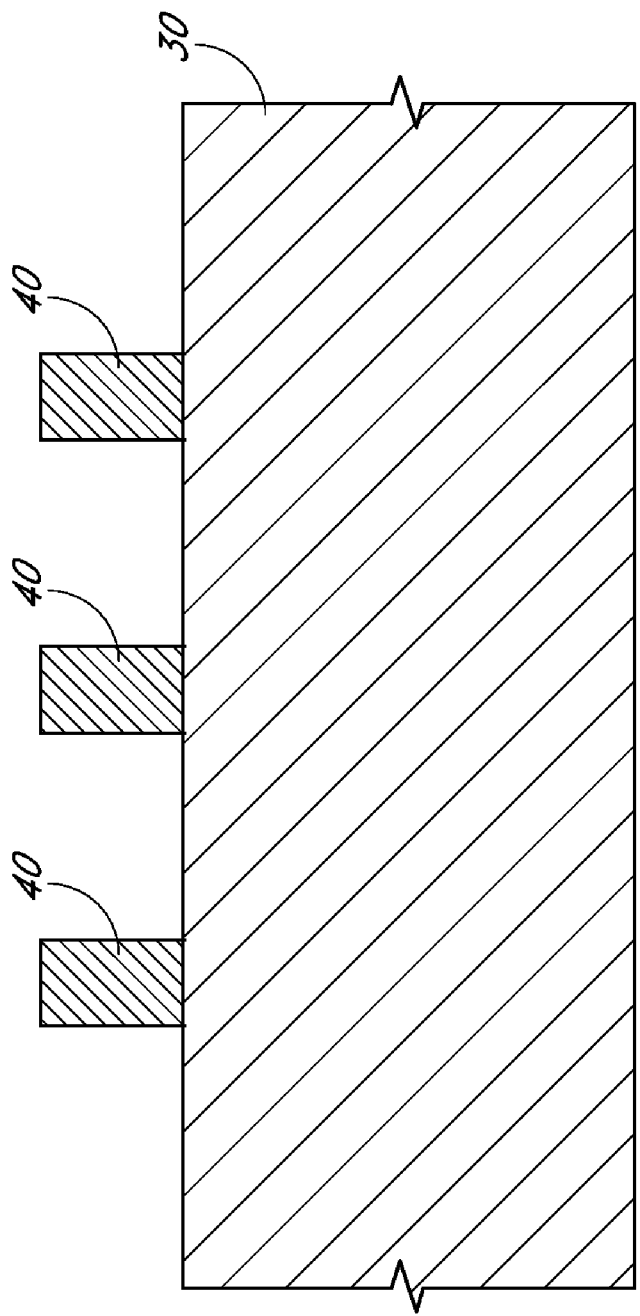
Figure 1D:
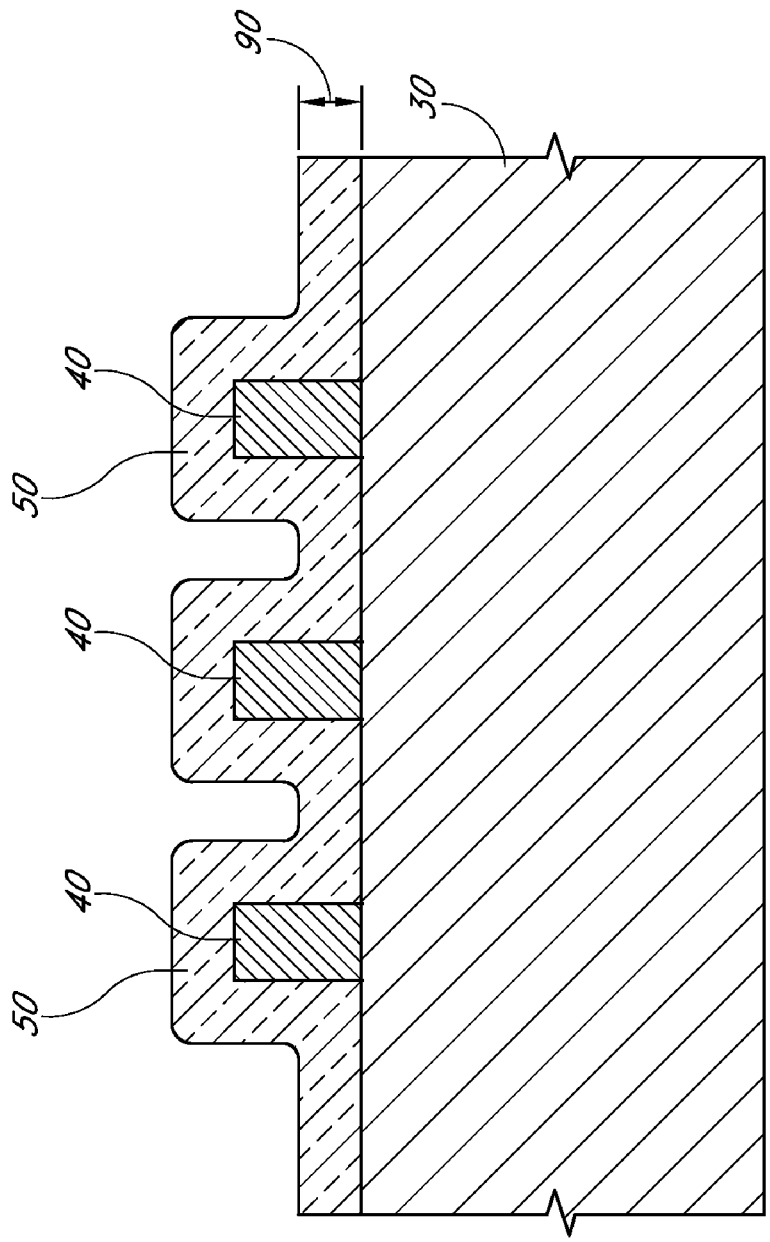
Figure 1E:
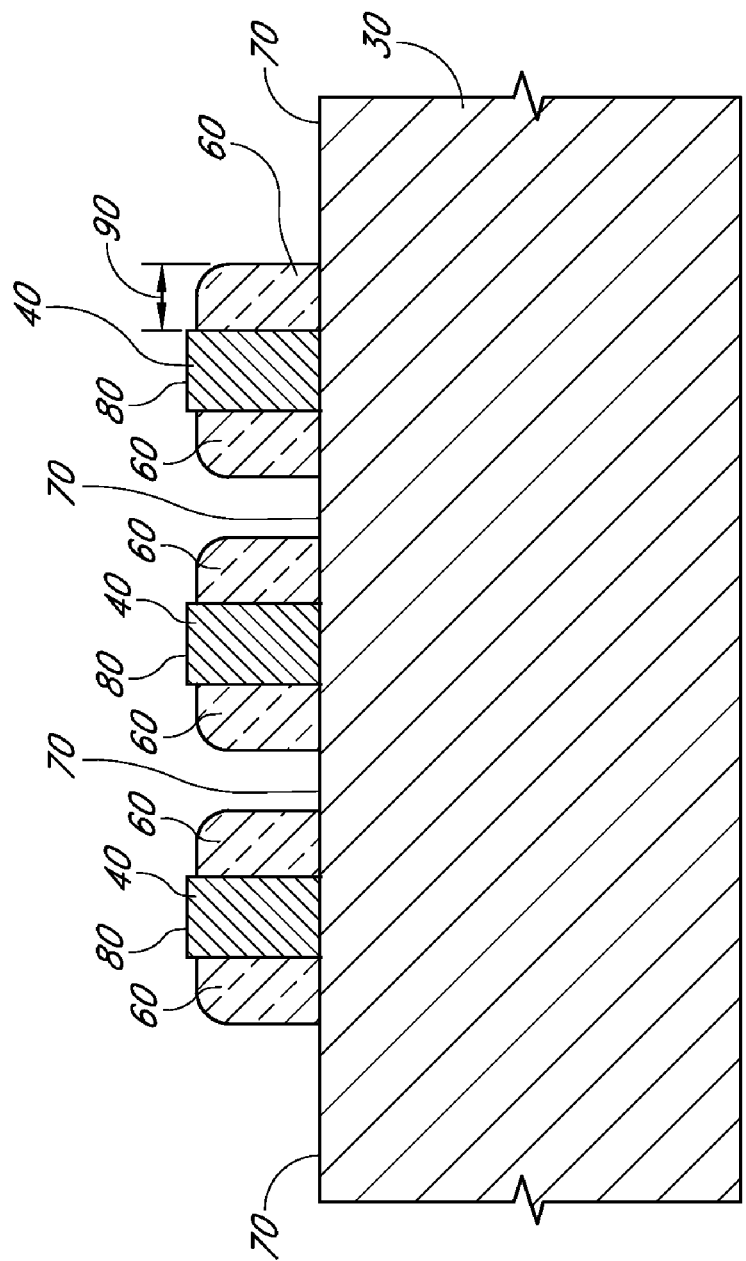
Figure 1F:
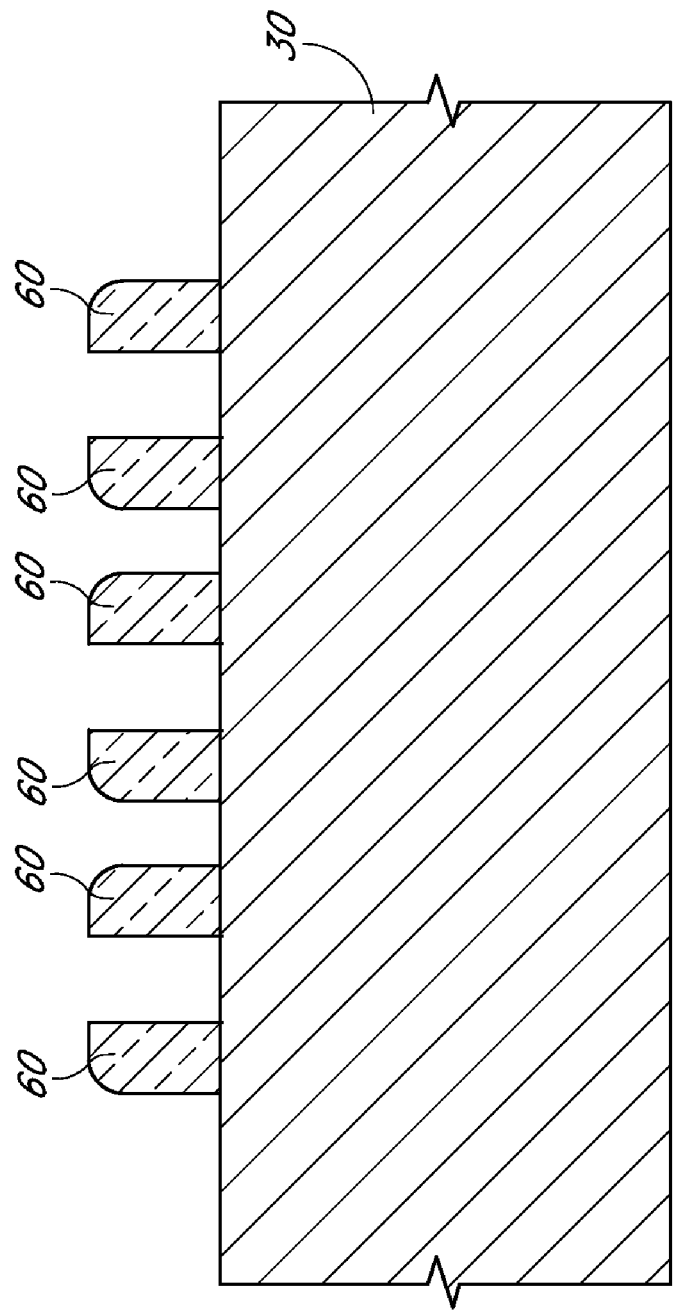
Figure 2A:
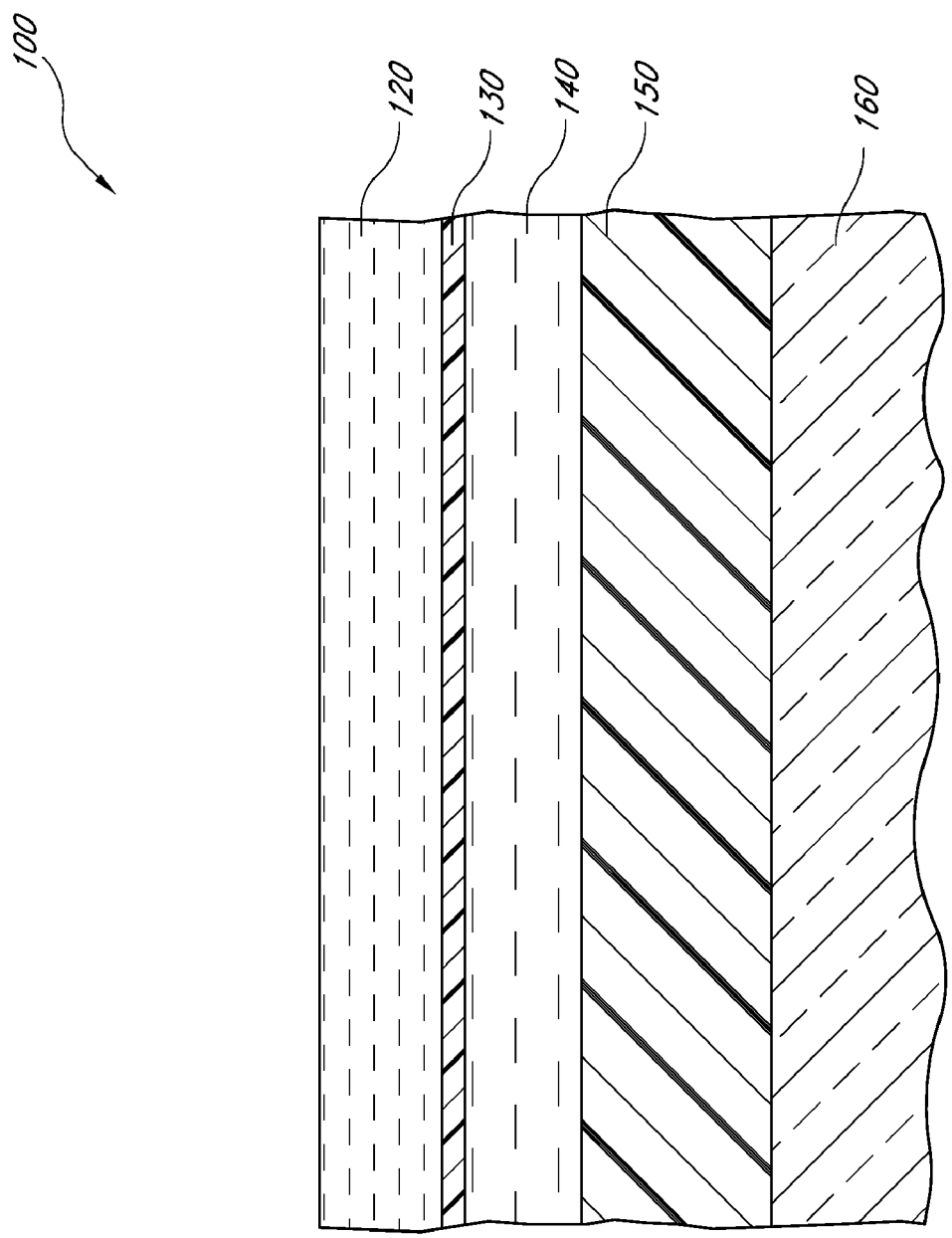
FIGS. 2A and 2B are schematic cross-sectional side and top plan views of a part of a partially formed integrated circuit, in accordance with preferred embodiments of the invention.
Figure 2B:
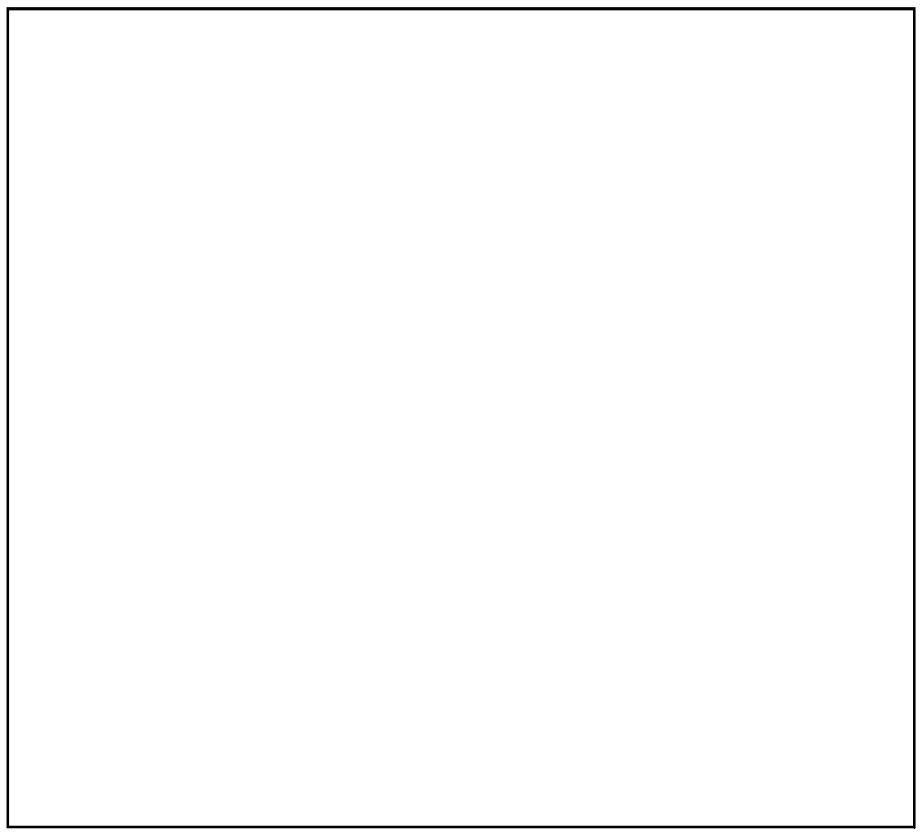

FIGS. 2A and 2B show cross-sectional side and top plan views of a portion of an integrated circuit 100. While the preferred embodiments can be used to form any integrated circuit, they are particularly advantageously applied to forming devices having arrays of electrical devices, including memory cell arrays for volatile and non-volatile memory devices such as DRAM, phase change memory (PCM), programmable conductor RAM (PCRAM), ROM or flash memory, including NAND flash memory, or integrated circuits having logic or gate arrays. For example, the logic array can be a field programmable gate array (FPGA) having a core array similar to a memory array and a periphery with supporting logics. Consequently, the integrated circuit 100 can be, e.g., a memory chip or a processor, which can include both a logic array and embedded memory, or any other integrated circuit having a logic or a gate array.

With reference to FIG. 2A, various masking layers 120-140 are preferably provided above a dielectric or insulating layer 150, which is disposed above a substrate 160 in the illustrated embodiment. The layers 120-140 will be etched to form a mask for patterning the dielectric layer 150, as discussed below. In the illustrated embodiment, the dielectric layer 150 comprises silicon oxide.

The materials for the layers 120-140 overlying the dielectric layer 150 are preferably chosen based upon consideration of the chemistry and process conditions for the various pattern forming and pattern transferring steps discussed herein. Because the layers between a topmost selectively definable layer 120 and the dielectric layer 150 preferably function to transfer a pattern derived from the selectively definable layer 120 to the dielectric layer 150, the layers 130-140 between the selectively definable layer 120 and the dielectric layer 150 are preferably chosen so that they can be selectively etched relative to other exposed materials. It will be appreciated that a material is considered selectively, or preferentially, etched when the etch rate for that material is at least about 2-3 times greater, preferably at least about 10 times greater, more preferably at least about 20 times greater and, most preferably, at least about 40 times greater than that for surrounding materials. It will be appreciated that one or more of the layers 120-140 can be omitted or substituted, or additional layers can be added, if suitable other materials, chemistries and/or process conditions are used. For example, the layer 130 can be omitted in some embodiments where the resolution enhancement properties of that layer, as discussed below, are not desired.

In the illustrated embodiment, the selectively definable layer 120 overlies a first hard mask, or etch stop, layer 130, which overlies a temporary layer 140, which overlies the dielectric layer 150 to be processed (e.g., etched) through a mask. The temporary layer 140 can also be referred to as a mandrel layer. Preferably, the mask through which the dielectric layer 150 is processed is formed of spacers 175 and 275 (FIGS. 15A and 15B), as discussed below.

With continued reference to FIG. 2B, the selectively definable layer 120 is preferably photodefinable, e.g., formed of a photoresist, including any photoresist known in the art. For example, the photoresist can be any photoresist compatible with 157 nm, 193 nm, 248 nm or 365 nm wavelength systems, 193 nm wavelength immersion systems, extreme ultraviolet systems (including 13.7 nm wavelength systems) or electron beam lithographic systems. In addition, maskless lithography, or maskless photolithography, can be used to define the selectively definable layer 120. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the layer 120 and any subsequent resist layers can be formed of a resist that can be patterned by nano-imprint lithography, e.g., by using a mold or mechanical force to pattern the resist.

The material for the hard mask layer 130 preferably comprises an inorganic material. Exemplary materials include silicon oxide ($SiO_2$), silicon or a dielectric anti-reflective coating (DARC), such as a silicon-rich silicon oxynitride. Preferably, the hard mask layer 130 is a DARC. Using DARCs for the hard mask layer 130 can be particularly advantageous for forming patterns having pitches near the resolution limits of a photolithographic technique. The DARCs can enhance resolution by minimizing light reflections, thus increasing the precision with which photolithography can define the edges of a pattern.

Due to its excellent etch selectivity relative to a variety of materials, including oxides, nitrides and silicon, the temporary layer 140 is preferably formed of amorphous carbon. More preferably, the amorphous carbon is a form of amorphous carbon that is highly transparent to light and that offers further improvements for photo alignment by being transparent to the wavelengths of light used for such alignment. Deposition techniques for forming such transparent carbon can be found in A. Helmbold and D. Meissner, Thin Solid Films, 283 (1996) 196-203, the entire disclosure of which is incorporated herein by reference. It will be appreciated that the oxide is preferably a form of silicon oxide and the nitride is preferably a form of silicon nitride.

The material for the temporary layer 140 is preferably chosen based upon the materials used for the lower level spacers 175 (FIGS. 9A and 9B), the upper level spacers 275 (FIGS. 14 and 14B) and the underlying dielectric layer 150.

As discussed herein, the layer 140 is preferably formed of amorphous carbon. An exemplary combination of materials is listed in the table below:

Exemplary Spacer, Mandrel Layer, Hard Mask and Underlying Materials

| Lower Level Spacers | Upper Level Spacers | Hard Mask | Mandrel Layer | Underlying Dielectric Layer |
|---|---|---|---|---|
| Amorphous Silicon | Silicon Oxide | DARC | Amorphous Carbon | Silicon Oxide |

In addition to selecting appropriate materials for the various layers, the thicknesses of the layers 120-140 are preferably chosen depending upon compatibility with the etch chemistries and process conditions described herein. As discussed above, when etching a material through a mask of another material, e.g., when transferring a pattern from an overlying layer to an underlying layer by selectively etching the underlying layer, materials from both layers are removed to some degree. Thus, the upper layer is preferably thick enough so that it is not worn away over the course of the pattern transfer.

In the illustrated embodiment, the photodefinable layer 120 is preferably about 50-300 nm thick and, more preferably, about 200-250 nm thick. It will be appreciated that, in cases where the layer 120 is a photoresist, this thickness can vary depending upon the wavelength of light used to pattern the layer 120. A thickness of about 50-300 nm thick and, more preferably, about 200-250 nm thick is particularly advantageous for 248 nm wavelength systems.

The hard mask layer 130 is preferably about 10-40 nm thick and, more preferably, about 15-30 nm thick. The temporary layer 140 is preferably about 50-200 nm thick and, more preferably, about 80-120 nm thick. Because spacers 175 are formed around mandrels 124b (FIG. 9A), which are formed from the temporary layer 140, and because the spacers 175 are used as a mask in etching underlying material, the height of the spacers 175 is typically determined by the height of the mandrels 140. As a result, the height of the temporary layer 140 is preferably chosen to form spacers 175 with a height sufficient to account for removal of spacer material during etching of underlying material. It will be appreciated that the height of the spacers can be limited by the structural integrity and the aspect ratio of the spacers, since very tall spacers may collapse or otherwise deform.

The various layers discussed herein can be formed by various methods known in the art. For example, spin-on-coating processes can be used to form photodefinable layers. Various deposition processes, such as sputtering, chemical vapor deposition or atomic layer deposition, can be used to form other layers, such as the hard mask layers.

Preferably, a low temperature chemical vapor deposition (CVD) process is used to deposit the hard mask layer 130 or any other materials, e.g., a spacer material, over the temporary layer 140, especially in cases where the temporary layer 140 is formed of amorphous carbon. Preferably, materials are deposited on the temporary layer 140, or other layers formed of amorphous carbon, at temperatures of less than about 550° C. and, more preferably, less than about 450° C. and, most preferably, less than about 400° C. Such low temperature deposition processes advantageously prevent chemical or physical disruption of the amorphous carbon layer(s).

The amorphous carbon layers described herein can be formed by chemical vapor deposition using a hydrocarbon compound, or mixtures of such compounds, as carbon precursors. Exemplary precursors include propylene, propyne, propane, butane, butylene, butadiene and acetelyne. A suitable method for forming amorphous carbon layers is described in U.S. Pat. No. 6,573,030 B1, issued to Fairbairn et al. on Jun. 3, 2003, the entire disclosure of which is incorporated herein by reference. In addition, the amorphous carbon may be doped. A suitable method for forming doped amorphous carbon is described in U.S. patent application Ser. No. 10/652,174 to Yin et al., filed Aug. 22, 2003, the entire disclosure of which is incorporated herein by reference.

Figure 3B:
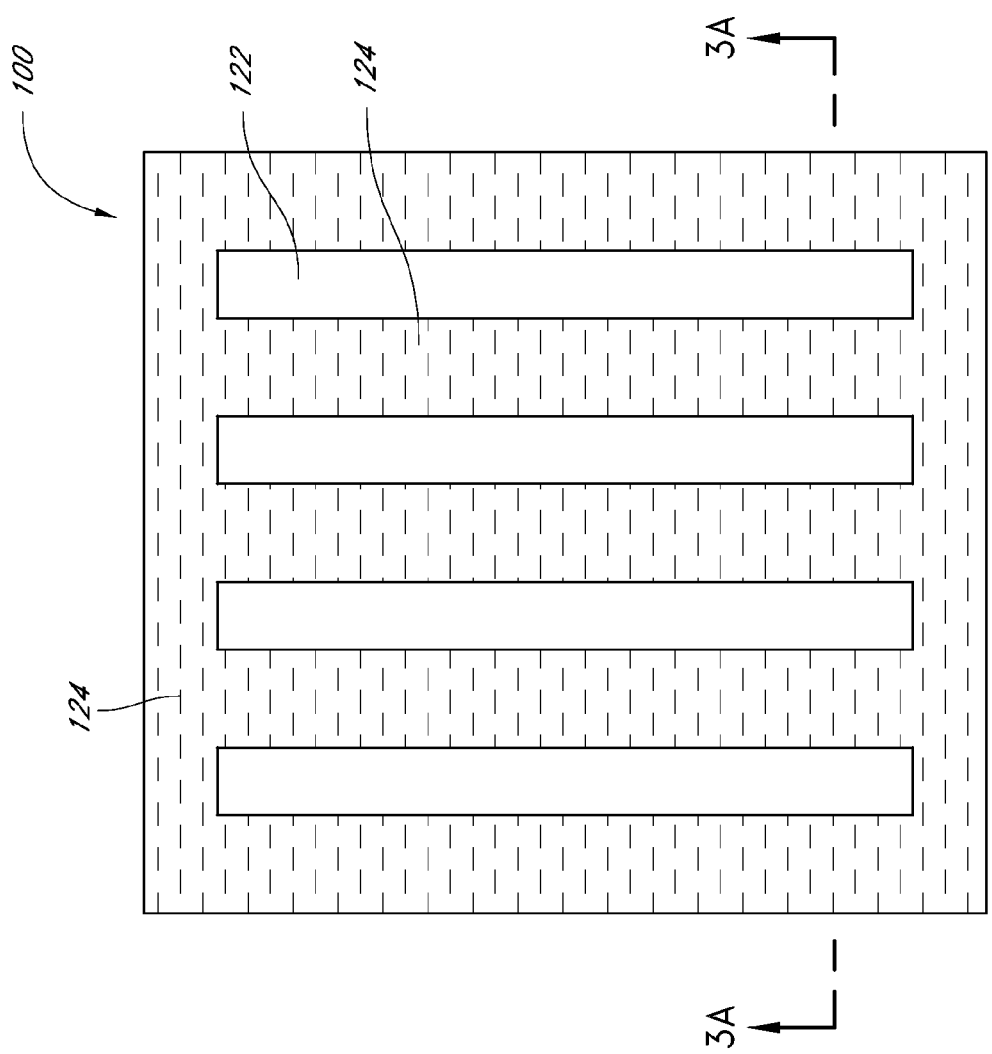

With reference to FIGS. 3A and 3B, a pattern comprising spaces or trenches 122, which are delimited by photodefinable material features 124, is formed in the photodefinable layer 120. The trenches 122 can be formed by, e.g., photolithography with 248 nm or 193 nm light, in which the layer 120 is exposed to radiation through a reticle and then developed. After being developed, the remaining photodefinable material, photoresist in the illustrated embodiment, forms mask features such as the illustrated lines 124 (shown in cross-section only).

The pitch of the resulting lines 124 is equal to the sum of the width of a line 124 and the width of a neighboring space 122. To minimize the critical dimensions of features formed using this pattern of lines 124 and spaces 122, the pitch can be at or near the limits of the photolithographic technique used to pattern the photodefinable layer 120. For example, for photolithography utilizing 248 nm light, the pitch of the lines 124 can be about 100 nm. Thus, the pitch may be at the minimum pitch of the photolithographic technique and the spacer pattern discussed below can advantageously have a pitch below the minimum pitch of the photolithographic technique. Alternatively, because the margin of error for position and feature size typically increases as the limits of a photolithographic technique are approached, the lines 124 can be formed having larger feature sizes, e.g., 200 nm, to minimize errors in the positions and sizes of the lines 124.

Figure 4A:
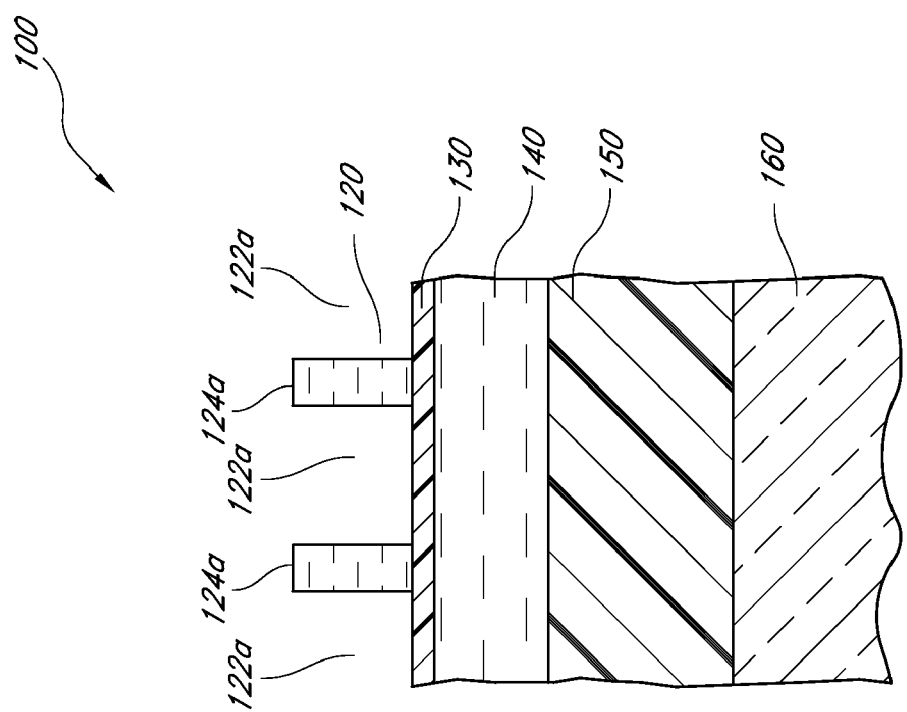
FIGS. 4A and 4B are schematic cross-sectional side and top plan views of the partially formed integrated circuit of FIGS. 3A and 3B after widening spaces between lines in the photoresist layer, in accordance with preferred embodiments of the invention.
Figure 4B:
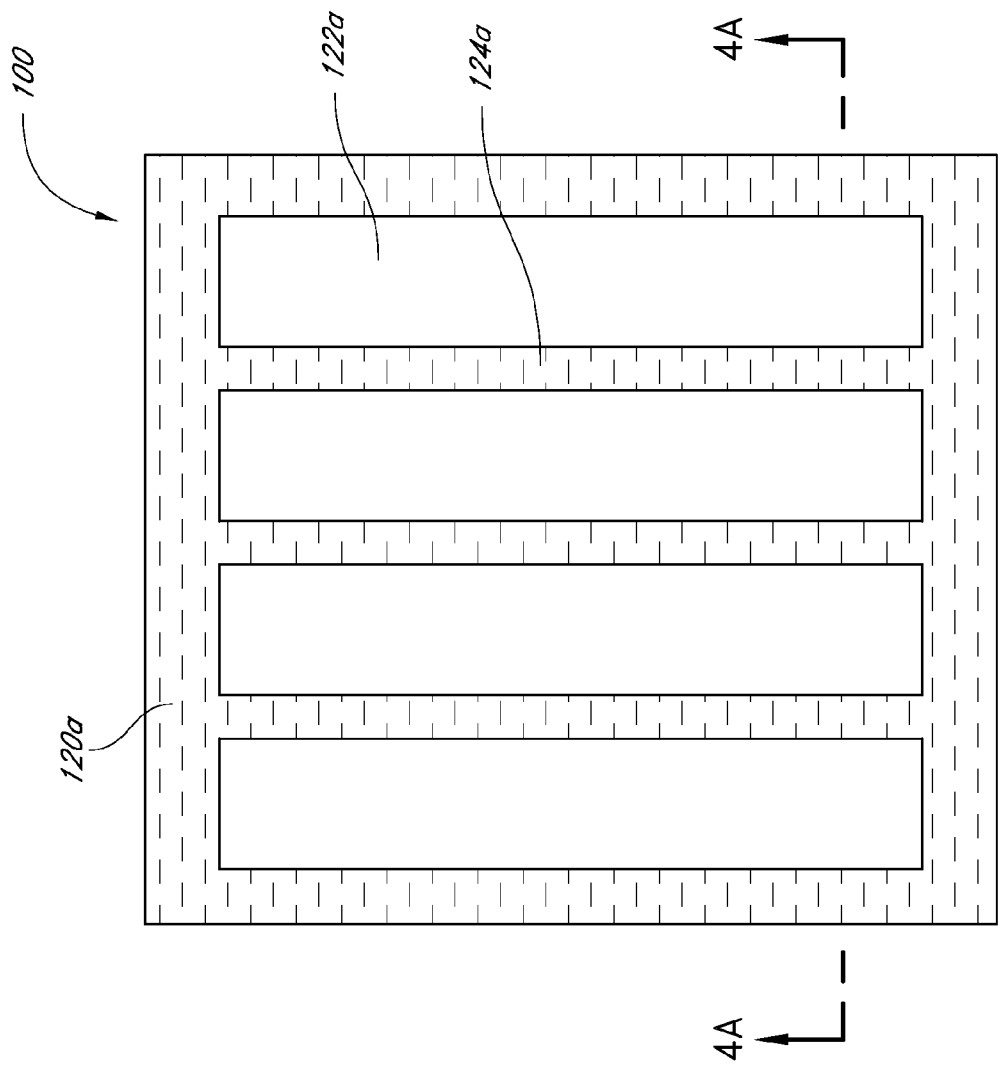

As shown in FIGS. 4A and 4B, the spaces 122 are preferably widened by etching the photoresist lines 124, to form modified spaces 122a and lines 124a. The photoresist lines 124 are preferably etched using an isotropic etch to "shrink" those features. Suitable etches include etches using an oxygen-containing plasma, e.g., a $SO_2/O_2/N_2/Ar$, $Cl_2/O_2/He$ or $HBr/O_2/N_2$ plasma. The extent of the etch is preferably selected so that the widths of the lines 124a are substantially equal to the desired spacing between the later-formed spacers 175, as will be appreciated from the discussion below. For example, the width of the lines 124 can be reduced from about 80-120 nm to about 35-70 nm and, more preferably, about 40-50 nm. Advantageously, the width-reducing etch allows the lines 124a to be narrower than would otherwise be possible using the photolithographic technique used to pattern the photodefinable layer 120. In addition, the etch can smooth the edges of the lines 124a, thus improving the uniformity of those lines. While the critical dimensions of the lines 124a can be etched below the resolution limits of the photolithographic technique, it will be appreciated that this etch does not alter the pitch of the spaces 122a and lines 124a, since the distance between identical points in these features remains the same.

Figure 5:
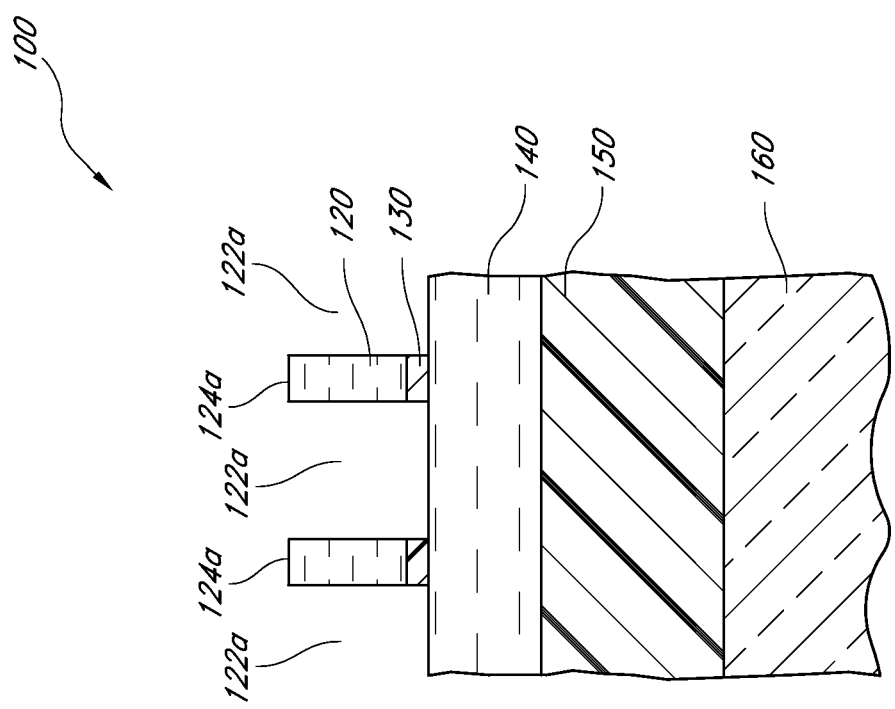
FIG. 5 is a schematic, cross-sectional side view of the partially formed integrated circuit of FIGS. 4A and 4B after etching through a hard mask layer, in accordance with preferred embodiments of the invention.

With reference to FIG. 5, the pattern in the (modified) photodefinable layer 120a is transferred to the hard mask layer 130. This transfer is preferably accomplished using an anisotropic etch, such as an etch using a fluorocarbon plasma, although a wet (isotropic) etch may also be suitable if the hard mask layer 130 is thin. Preferred fluorocarbon plasma etch chemistries include $CFH_3$, $CF_2H_2$, $CF_3H$ and/or $CF_4$/HBr for etching the illustrated DARC material.

Figure 6:
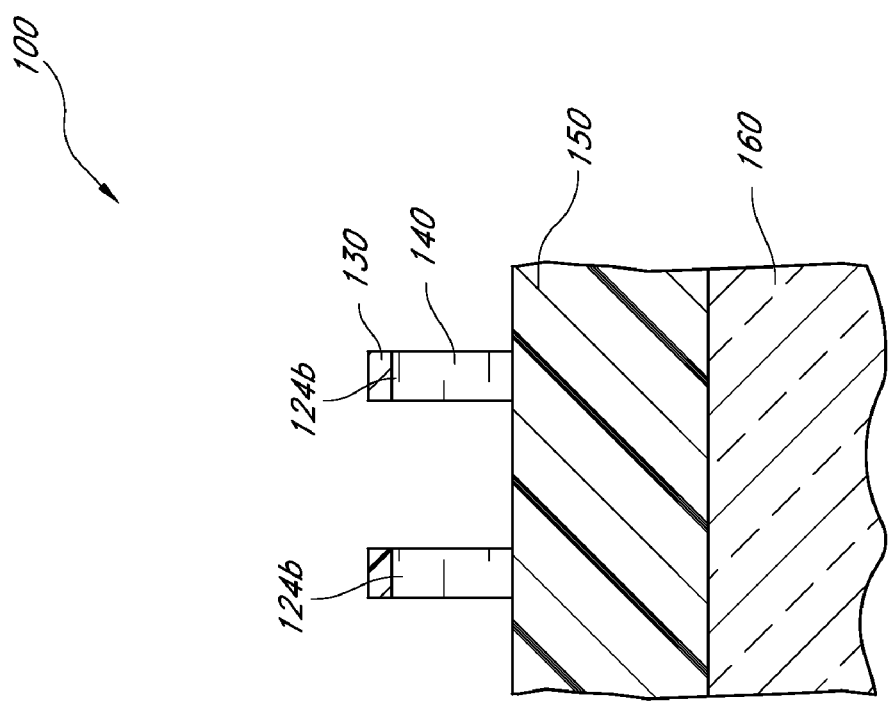
FIG. 6 is a schematic, cross-sectional side view of the partially formed integrated circuit of FIG. 5 after transferring a pattern from the hard mask layer to a temporary or mandrel layer to form mandrels on a first level, in accordance with preferred embodiments of the invention.
Figure 8:
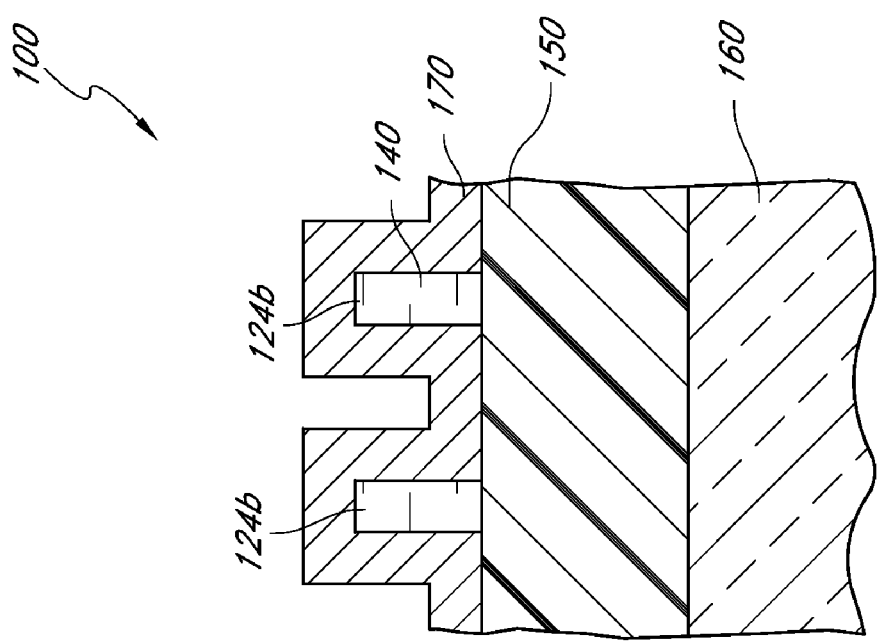
FIG. 8 is a schematic, cross-sectional side view of the partially formed integrated circuit of FIG. 7 after depositing a layer of a spacer material, in accordance with preferred embodiments of the invention.

With reference to FIG. 6, the pattern in the photodefinable layer 120a and the hard mask layer 130 is transferred to the temporary layer 140 to allow for deposition of a layer 170 of spacer material (FIG. 8). It has been found that the temperatures used for spacer material deposition are typically too high for photoresist to withstand. Thus, the pattern is preferably transferred from the photodefinable layer 120a to the temporary layer 140, which is formed of a material that can withstand the process conditions for spacer material deposition and etch, discussed below. In addition to having higher heat resistance than photoresist, the material forming the temporary layer 140 is preferably selected such that it can be selectively removed relative to the material for the spacers 175 (FIGS. 9A and 9B), the spacers 275 (FIGS. 14A and 14B) and the underlying dielectric layer 150. As noted above, the layer 140 is preferably formed of amorphous carbon and, more preferably, transparent carbon.

The pattern in the modified photodefinable layer 120a is preferably transferred to the temporary layer 140 using a $O_2$-containing plasma, e.g., a plasma containing $SO_2$, $O_2$ and Ar. Other suitable etch chemistries include a $Cl_2/O_2/SiCl_4$ or $SiCl_4/O_2/N_2$ or $HBr/O_2/N_2/SiCl_4$-containing plasma. Advantageously, the $SO_2$-containing plasma is used as it can etch carbon of the preferred temporary layer 140 at a rate greater than 20 times and, more preferably, greater than 40 times the rate that the hard mask layer 130 is etched. The etch chemistry is also preferably selective for the temporary layer 140 relative to the layer 150 or any intervening hard mask or etch stop layers (not shown) present between the layers 140 and 150. A suitable $SO_2$-containing plasma is described in U.S. patent application Ser. No. 10/931,772 to Abatchev et al., filed Aug. 31, 2004, the entire disclosure of which is incorporate herein by reference. It will be appreciated that the $SO_2$-containing plasma can simultaneously etch the temporary layer 140 and also remove the photodefinable layer 120a. The resulting lines 124b constitute the placeholders or mandrels along which a pattern of spacers 175 (FIGS. 9A and 9B) will be formed.

Figure 7:
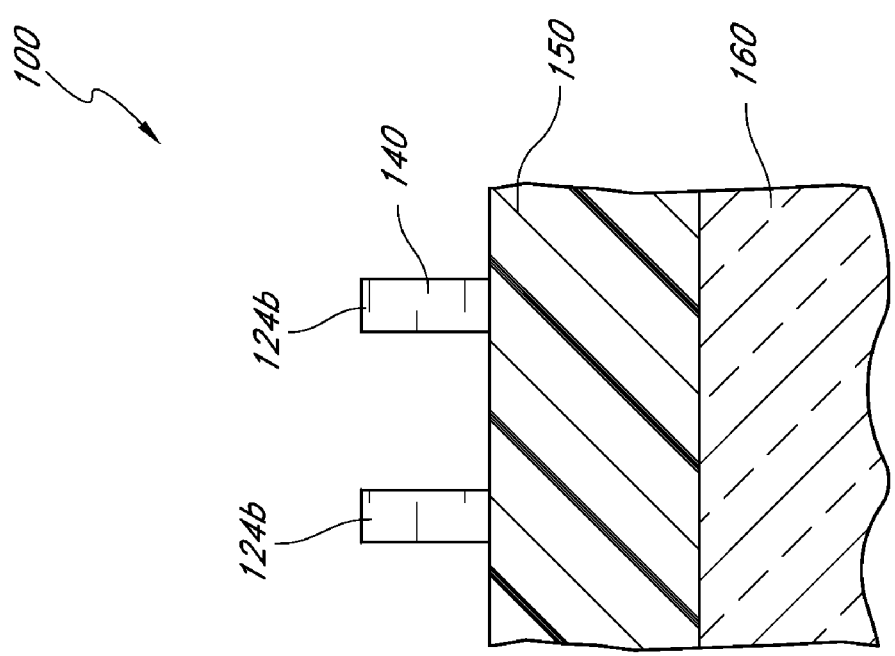
FIG. 7 is a schematic, cross-sectional side view of the partially formed integrated circuit of FIG. 6 after a hard mask layer removal, in accordance with preferred embodiments of the invention.
Figure 15A:
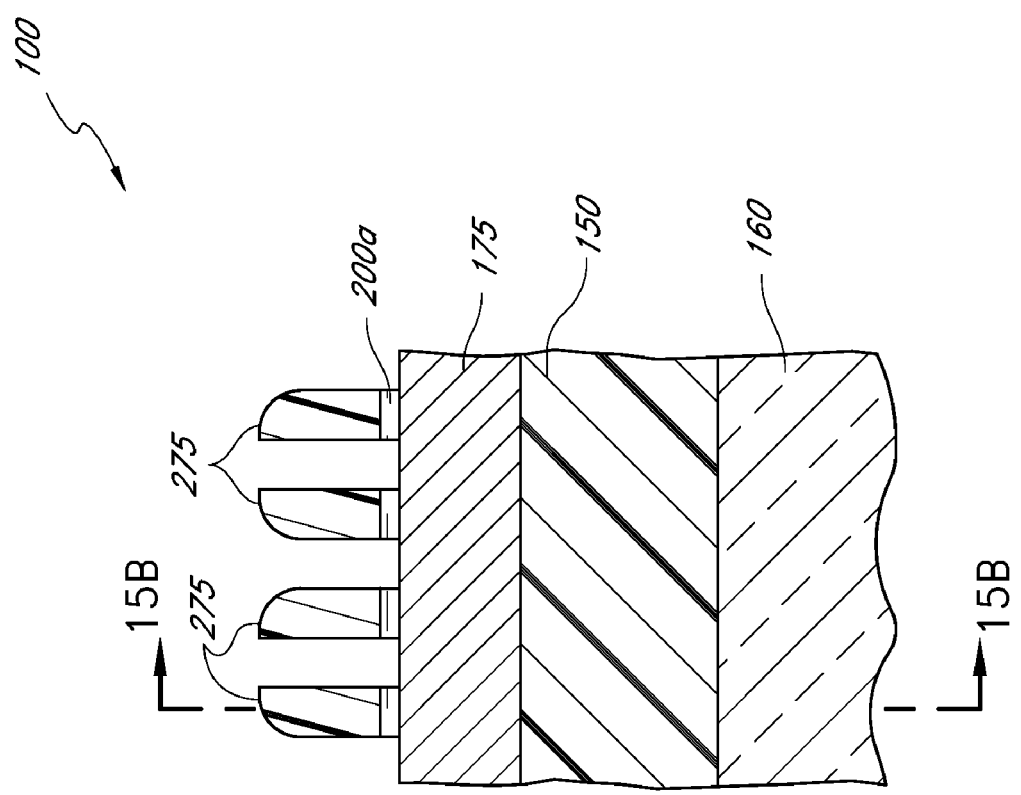
FIGS. 15A and 15B are schematic, cross-sectional side views
Figure 15B:
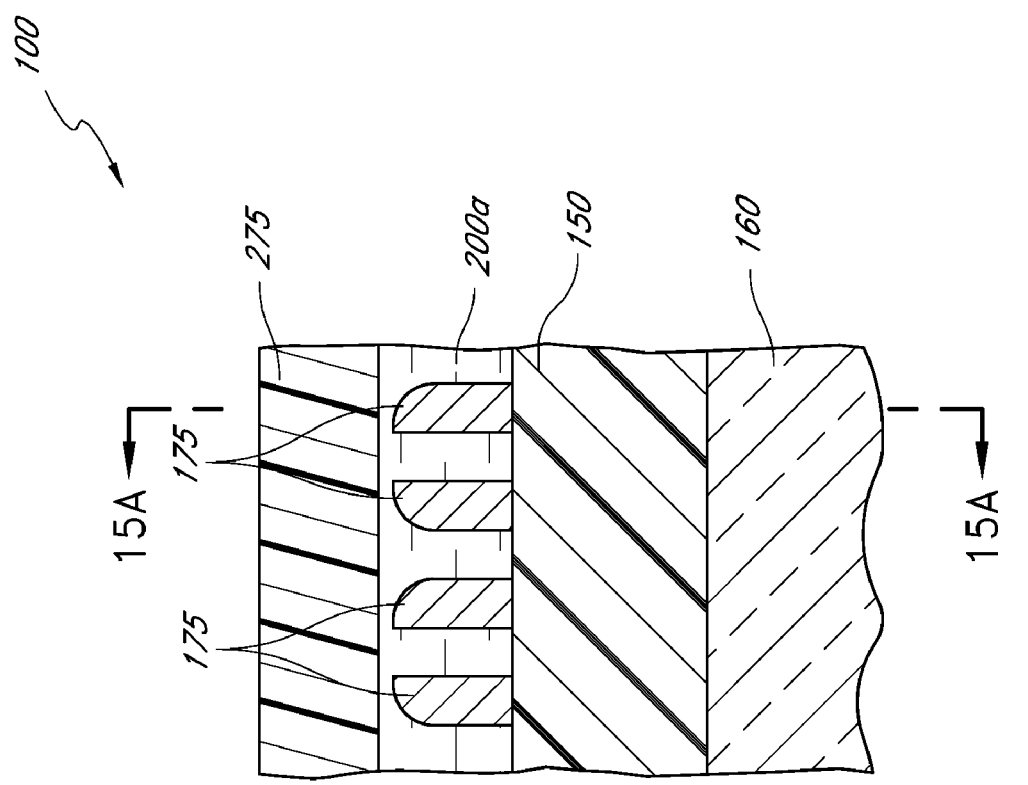

With reference to FIG. 7, the hard mask layer 130 can be removed to facilitate later mask formation by leaving the mandrels 124b exposed for subsequent etching (FIGS. 15A and 15B). The preferred hard mask layer 130 can be removed using a directional etch, or a wet etch with sufficient selectivity for the material of the layer 130, as known in the art.

Next, as shown in FIG. 8, a layer 170 of spacer material is preferably blanket deposited conformally over exposed surfaces, including the dielectric layer 150 and the top and sidewalls of the temporary layer 140. The spacer material is preferably a material that can act as a mask for transferring a pattern to the underlying dielectric layer layer 150. The spacer material preferably: 1) can be deposited with good step coverage; 2) can be deposited at a temperature compatible with the temporary layer 140; and 3) can be selectively etched relative to the temporary layer 140 and the dielectric layer 150. Preferred materials include silicon, silicon oxides and silicon nitrides. In the illustrated embodiment, the spacer material is amorphous silicon, which provides particular advantages in combination with other selected materials of the masking stack.

Figure 9B:
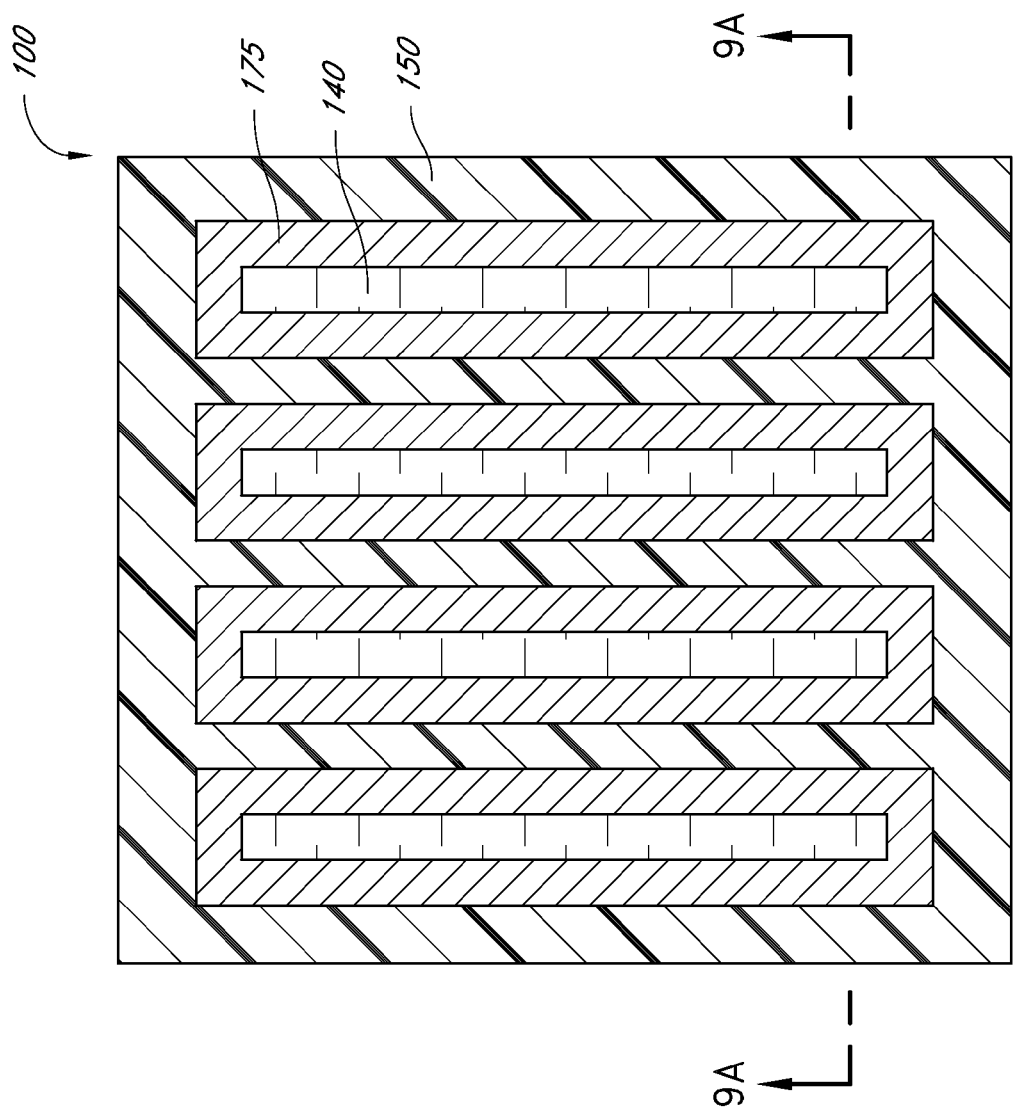

Preferred methods for spacer material deposition include chemical vapor deposition and atomic layer deposition. In one example, a plasma-enhanced CVD is used to deposit amorphous silicon by using $SiH_4$ and He in an Applied Materials' Producer™ system. The thickness of the layer 170 is preferably determined based upon the desired width of the spacers 175 (FIGS. 9A-9B). For example, in the exemplary embodiment, the layer 170 is preferably deposited to a thickness of about 20-80 nm and, more preferably, about 50-75 nm. Preferably, the step coverage is about 80% or greater and, more preferably, about 90% or greater.

With reference to FIGS. 9A and 9B, the amorphous silicon spacer layer 170 is then subjected to an anisotropic etch to remove spacer material from horizontal surfaces 180 of the partially formed integrated circuit 100. Such an etch, also known as a spacer etch, can be performed using, e.g., a HBr/$Cl_2$-containing plasma. Thus, pitch multiplication has been accomplished to form spacers 175. In the illustrated embodiment, the pitch of the spacers 175 is roughly half that of the photoresist lines 124 and spaces 122 (FIGS. 3A-3B) originally formed by photolithography. Where the photoresist lines 124 had a pitch of about 200 nm, spacers 175 having a pitch of about 100 nm or less (for a width of about 50 nm) can be formed. It will be appreciated that because the spacers 175 are formed on the sidewalls of the features or lines 124b, the spacers 175 generally follow the outline of the pattern of features or lines 124a in the modified photodefinable layer 120a and, so, typically form a closed loop in the spaces 122a between the lines 124a, as illustrated in FIG. 9B.

Next, additional spacers are formed on a second level. The additional spacers are formed extending in a direction that is offset (non-parallel) from the direction in which the spacers 175 extend. Preferably, the mandrels 124b on the first level remain in place during the formation of the additional spacers.

Figure 10A:
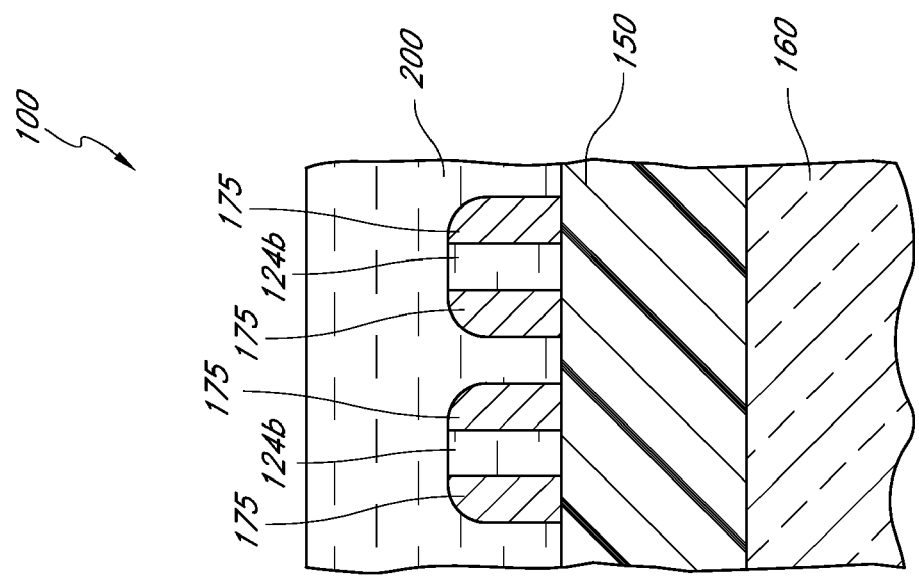
FIGS. 10A and 10B are schematic, cross-sectional side and top plan views of the partially formed integrated circuit of FIGS. 9A and 9B after forming a planarization, or second mandrel, layer, in accordance with preferred embodiments of the invention.
Figure 10B:
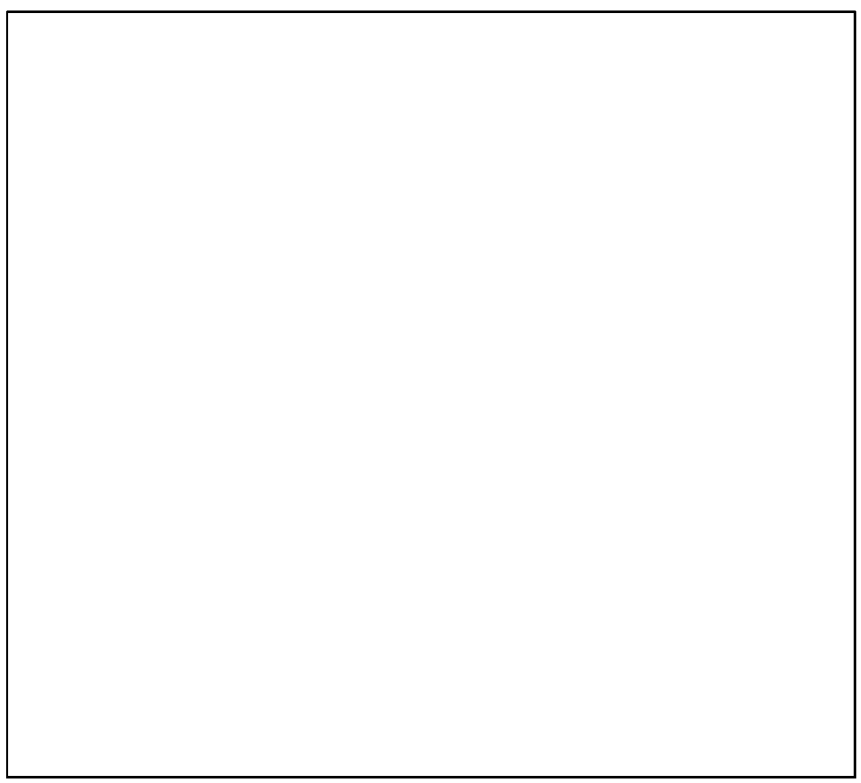

To allow the additional spacers to be formed, a planar surface is formed by depositing a planarizing material which fills the spaces around (between and over) the spacers 175 to form a planarizing layer 200, as shown in FIGS. 10A-10B. The planarizing layer 200 is preferably at least as tall as the spacers 175 and, more preferably, is sufficiently tall to allow mandrels to be formed from the planarizing layer 200 and above the spacers 175, as discussed below. In addition, the planarizing layer 200 is preferably formed of a material selectively etchable relative to both the spacers 175, the spacers 275 (FIGS. 14A-14B) and the dielectric layer 150. More preferably, the planarization material is the same material as that used to form the mandrels 124b. For example, the planarization material can be amorphous carbon and can be deposited as discussed above with respect to the layer 140 (FIG. 2A). In other embodiments, the planarization material and the mandrel material can be different materials or combinations of materials.

It will be appreciated that, after forming the spacers 175, the mandrels 124b are preferably retained between the spacers 175, thereby eliminating the need to deposit material into the spaces occupied by the mandrels 124b. It will be appreciated that those spaces can be narrow and, given that substantially vertical spacer walls delimit the spaces occupied by the mandrels 124b, the aspect ratio of the spaces can be large and deposition into those spaces can be difficult. Advantageously, retention of the mandrels 124b eliminates the need for deposition into those spaces, thereby allowing the formation of a more conformal, uniform planarizing layer 200.

Moreover, while the trenches 210 between the spacers 175 are of a similar width as the mandrels 124b in the illustrated embodiment, deposition into the trenches 210 is less difficult than deposition into the space occupied by the mandrels 124b, since the curved space surfaces 220 delimiting those trenches 210 advantageously facilitate deposition of the planarization material into those trenches 210. It will be appreciated that the curved spacer surfaces can effectively reduce the aspect ratio of the trenches 210 and/or aid in funneling deposition material or precursors into those trenches 210.

After depositing the planarization material, which preferably acts as the mandrel material for a second set of mandrels, the planarizing or second mandrel layer 200 can optionally be subjected to a planarization process. Such a process can be desirable, e.g., if the planarizing layer 200 is not sufficiently flat to allow for high quality results in subsequent photolithography steps. For example, the planarizing layer 200 can be subjected to a chemical mechanical polishing (CMP). In other exemplary embodiments, one or more additional layers can be deposited and then etched and/or subjected to CMP to form a highly planar top surface. For example, a bottom anti-reflective coating (BARC) can be deposited and subjected to a dry etch to form a highly planar surface over the planarizing layer 200. In other embodiments, the planarization material can be a reflowable material such as borophosphosilicate glass or spin-on glass, which can be deposited and then subjected to an anneal to form a highly planar surface. Preferably, as discussed above, the planarization material is amorphous carbon, which is preferably deposited to a height sufficient to allow the formation of mandrels from the planarizing layer 200.

Figure 11:
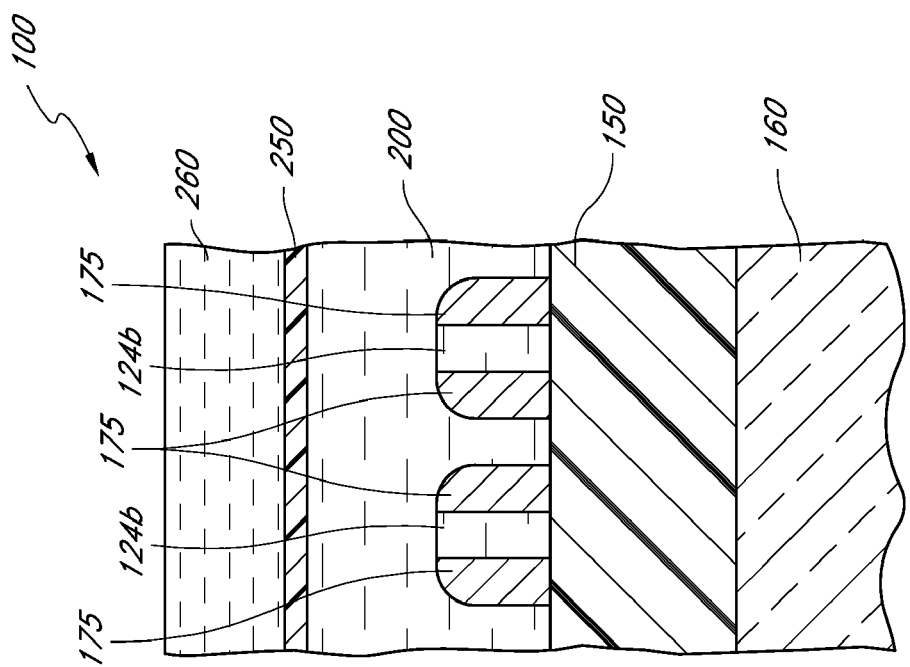
FIG. 11 is a schematic, cross-sectional side view of the partially formed integrated circuit of FIGS. 10A and 10B after depositing a hard mask layer and a photodefinable layer, respectively, in accordance with preferred embodiments of the invention.

With reference to FIG. 11, a sequence of layers 250-260 is deposited to allow patterning of mandrels in the planarizing layer 200. For example, a hard mask layer 250 comprising, e.g., a DARC, is deposited over the planarizing layer 200 and a photodefinable layer 260 comprising, e.g., a photoresist, is deposited over the hard mask layer 250.

Figure 12A:
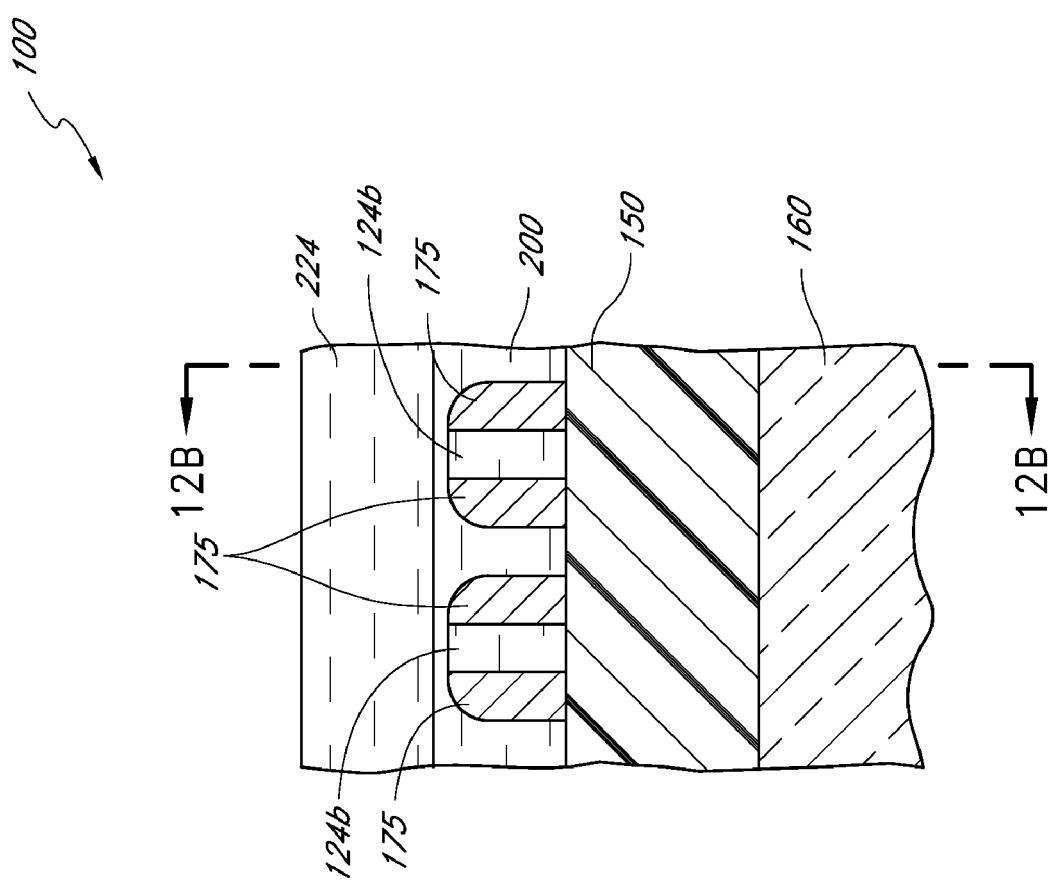
FIGS. 12A and 12B are schematic, cross-sectional side views of the partially formed integrated circuit of FIG. 11 after forming a pattern of mandrels in the planarization layer, on a second level, in accordance with preferred embodiments of the invention.
Figure 12B:
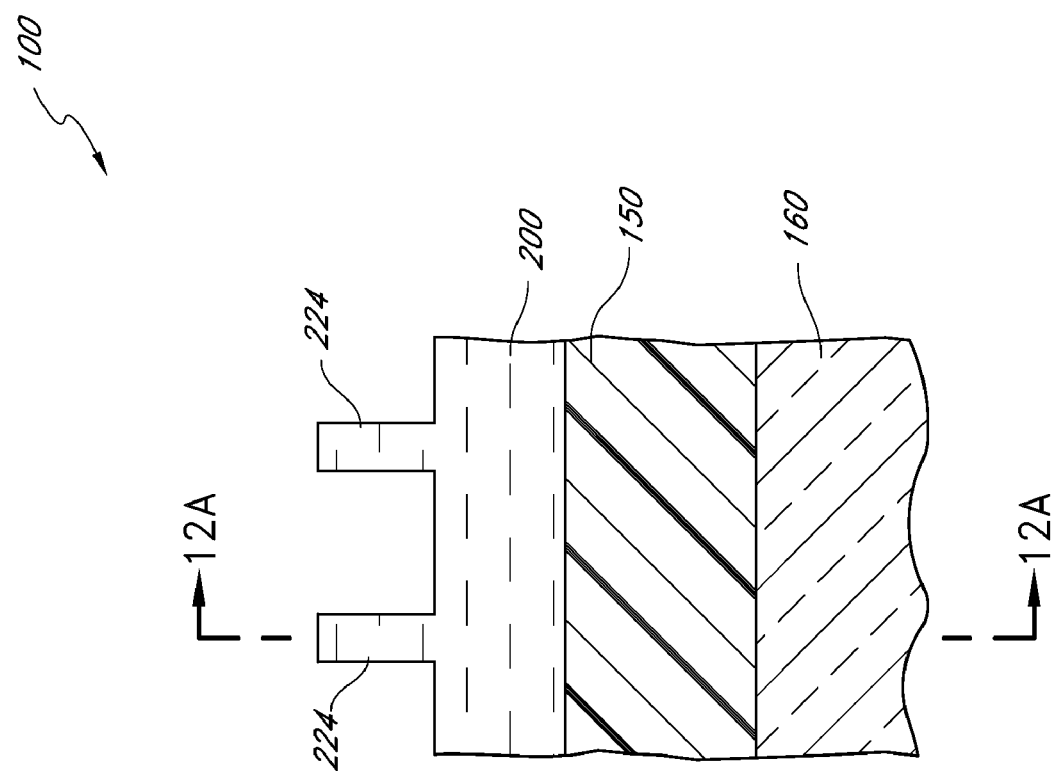

Preferably, applying again the steps discussed above with reference to FIGS. 2A-9B, the photoresist layer 260 can be etched, trimmed and the resulting pattern can be transferred to the hard mask layer 250 and then transferred to the planarizing layer 200 to form a pattern of mandrels 224, as shown in FIGS. 12A and 12B.

Figure 13:
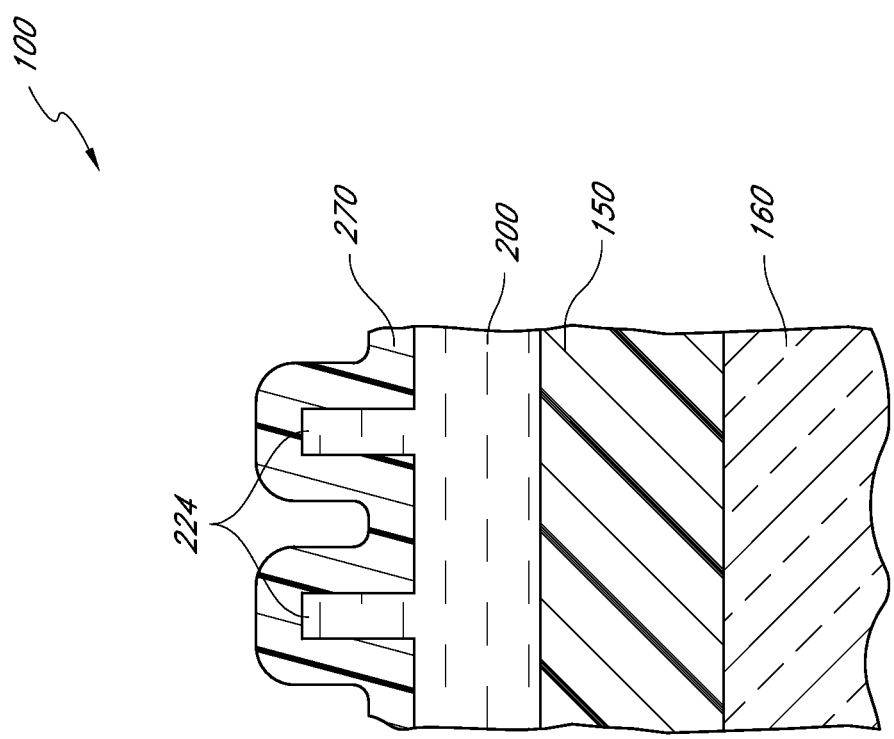
FIG. 13 is a schematic, cross-sectional side view of the partially formed integrated circuit of FIG. 12 after depositing a spacer material around the mandrels, in accordance with preferred embodiments of the invention.

With reference to FIG. 13, a spacer layer 270 is deposited around the mandrels 224. As noted above, the spacer layer 270 can be formed of any material having deposition and etch properties compatible with the other materials used herein. In the illustrated embodiment, the spacer material is silicon oxide which is preferably deposited at a temperature of less than about 550° C. and, more preferably, less than about 450° C. and, most preferably, less than about 400° C. The silicon oxide can be deposited by chemical vapor deposition, e.g., using $O_3$ and TEOS in a deposition system such as Applied Materials' Producer® HARP™ system. Because a dimension of the contact vias 310 (FIGS. 17A-17B) to later be formed is dependent on the width of and the distance between the spacers 275 and because the thickness of the spacer layer 270 substantially corresponds to the width of the spacers 275 (FIGS. 14a and 14B), the thickness of the spacer layer 270 is preferably chosen with reference to the distance between the mandrels 224 and with reference to the desired size of the contact vias to be formed using the spacers 275 as a mask. In the illustrated embodiment, the thickness of the spacer layer 270 is preferably about 50-75 nm to form contact vias having widths and lengths of about 50 nm.

Figure 14A:
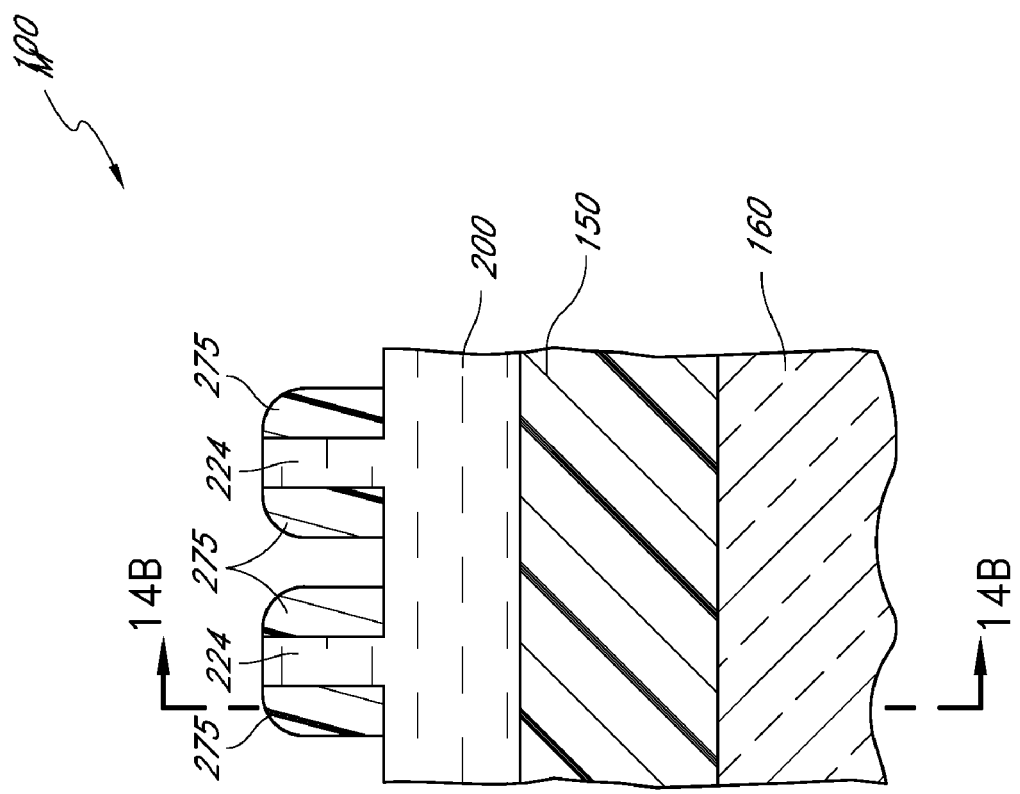
FIGS. 14A and 14B are schematic, cross-sectional side views
Figure 14B:
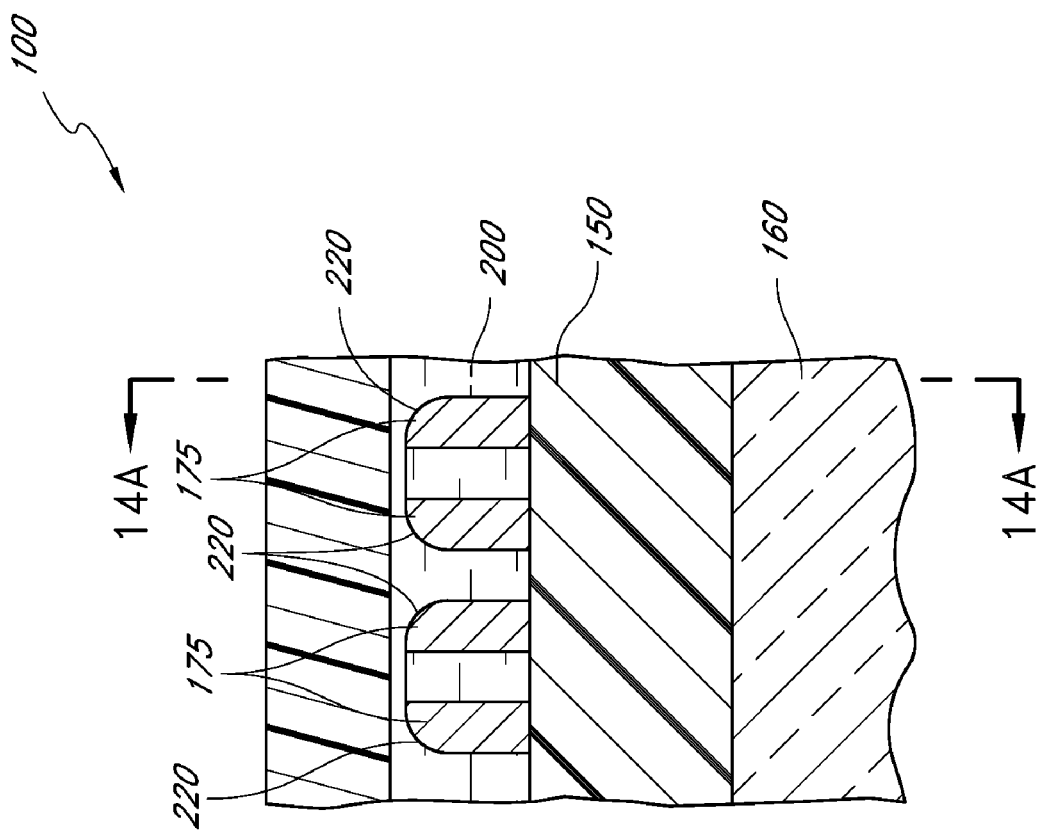
Figure 14C:
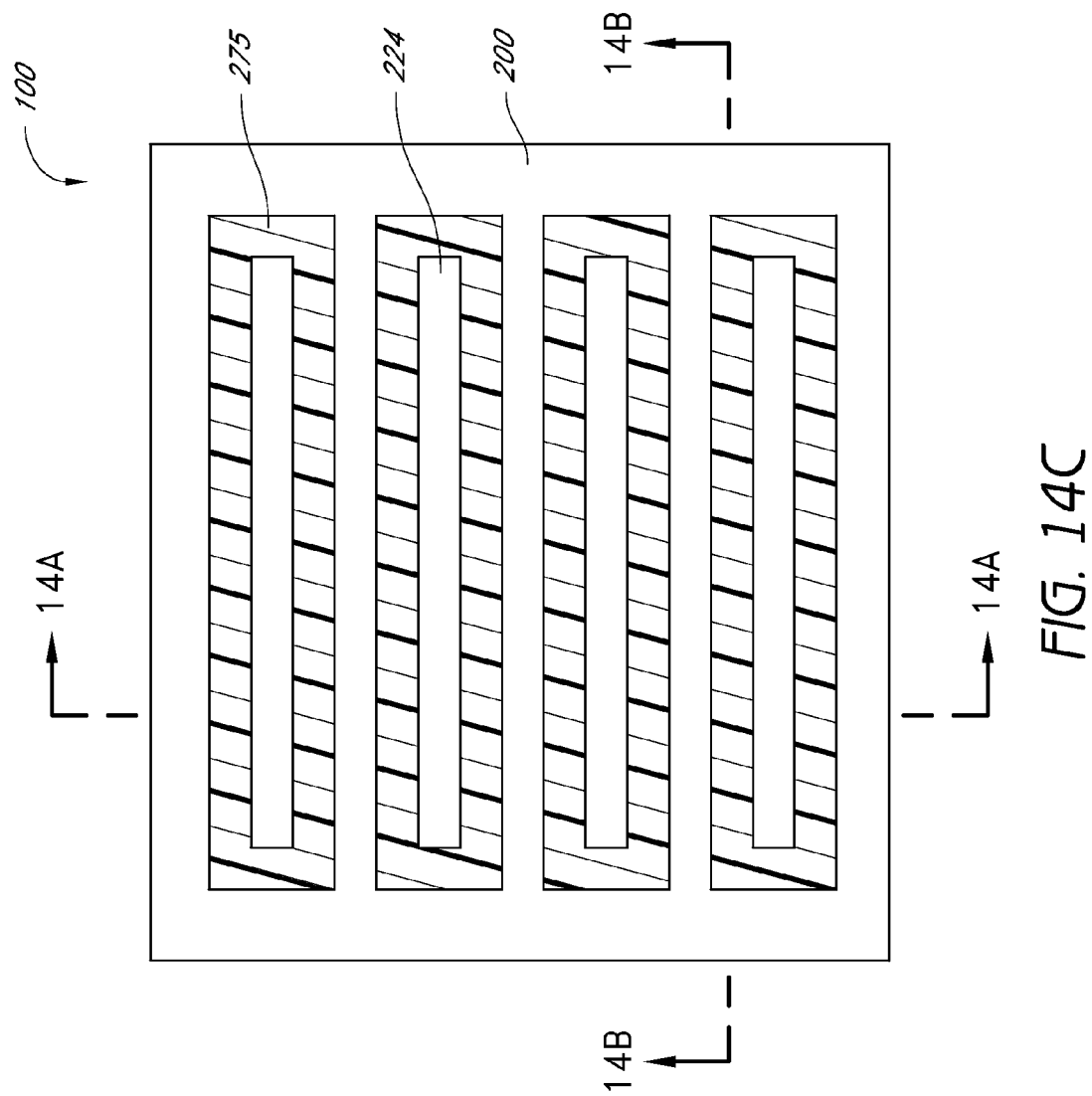
FIG. 14C is a top plan view of the partially formed integrated circuit of FIG. 13 after performing a spacer etch to form spacers on a second level over the planarization layer, in accordance with preferred embodiments of the invention.

With reference to FIGS. 14A-14C, a spacer etch is performed to form the spacers 275, which are preferably orthogonal to the spacers 175. The spacer etch preferably comprises a fluorocarbon plasma, e.g., a $CF_4/CHF_3$, $C_4F_8/CH_2F_2$ or $CHF_3/Ar$-containing plasma. FIG. 14A is a cross-sectional view, taken along a plane perpendicular to the length of the spacers 175, of the partially fabricated integrated circuit 100. FIG. 14B is a cross-sectional view, taken along a plane perpendicular to the length of the spacers 275, of the partially fabricated integrated circuit 100. FIG. 14C is a top view of the integrated circuit 100.

Figure 15C:
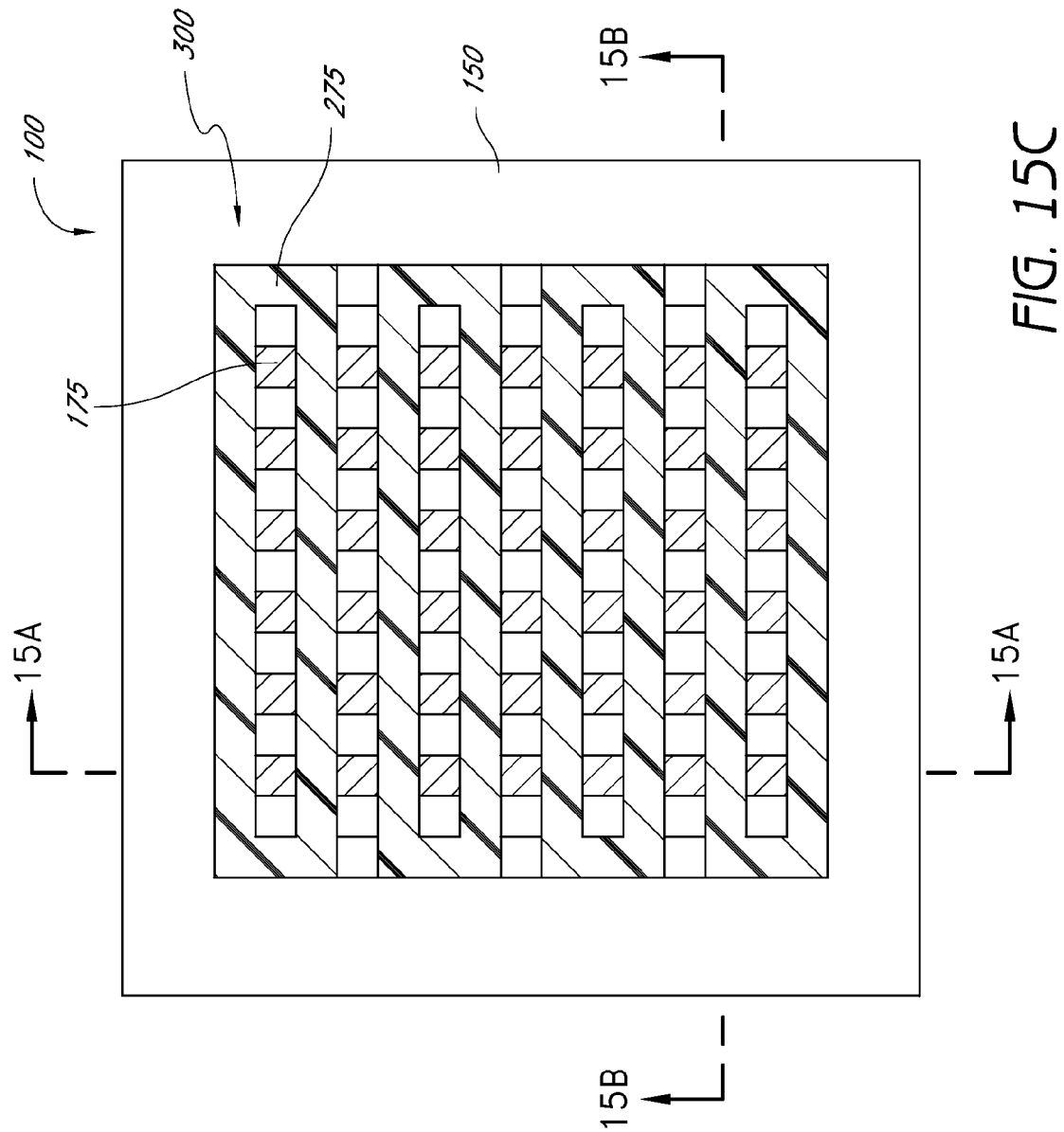
FIG. 15C is a top plan view of the partially formed integrated circuit of FIGS. 14A-14C after directionally etching exposed mandrel material on the first and the second levels, in accordance with preferred embodiments of the invention.

With reference to FIGS. 15A-15C, the mandrels 224 and the planarizing layer 200 are preferably selectively anisotropically etched relative to the spacers 175 and 275. Examples of suitable etch chemistries are $O_2$-containing plasmas, e.g., a $SO_2/O_2/Ar$, $Cl_2/O_2/SiCl_4$, $SiCl_4/O_2/N_2$ or $HBr/O_2/N_2/SiCl_4$-containing plasma. With reference to FIG. 15A, it will be appreciated that the spacers 275 shield parts 200a of the second planarizing or mandrel layer 200 from the etch. The unetched parts 200a of the layer 200 support the spacers 275 above the level of the spacers 175. Thus, with reference to FIG. 15B, a pattern 300 comprising a matrix of orthogonal mask lines comprising the spacers 175 and 275 is formed above the dielectric layer 150.

Next, the pattern 300 can be transferred to the underlying dielectric layer 150.

Figure 16B:
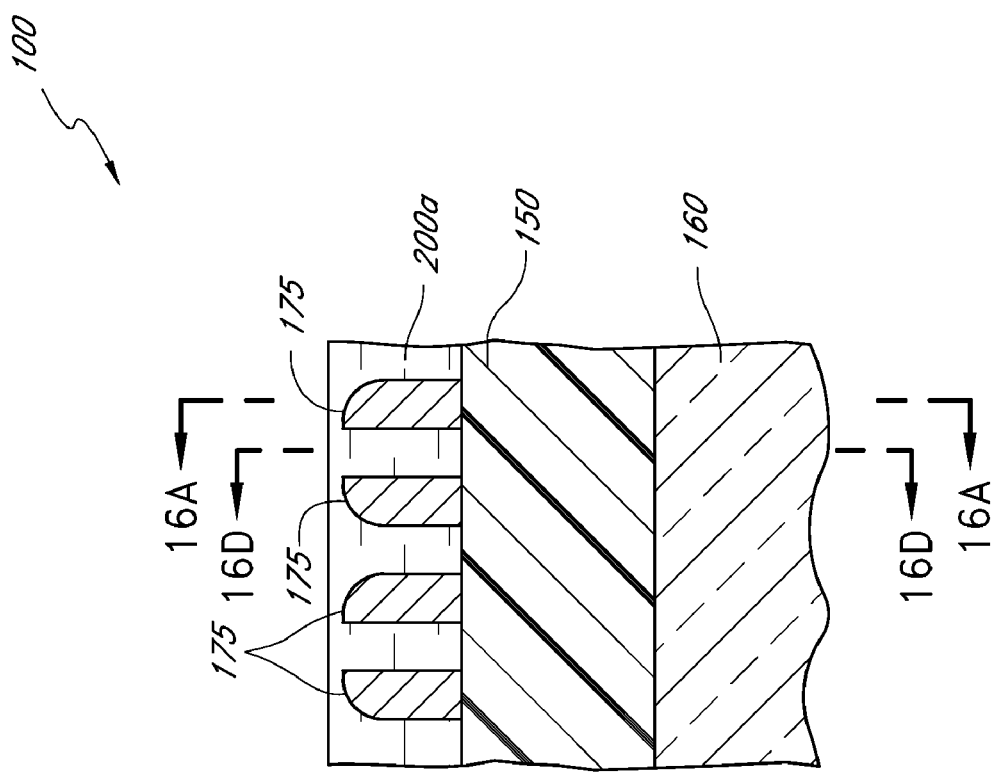
Figure 16C:
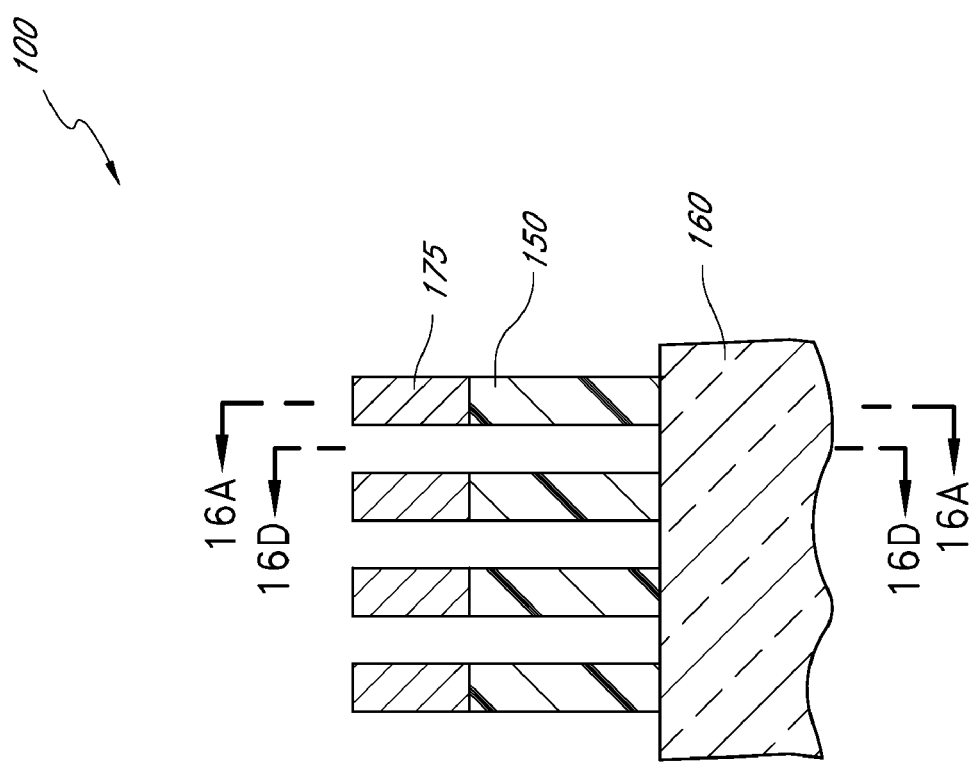

With reference to FIGS. 16A-16E, the dielectric layer 150 is selectively etched relative to the spacers 175 and 275. In the illustrated embodiment, the lower or first spacers 175 act as a hard mask in a first lateral direction and the upper or second spacers 275 act as a hard mask in a second lateral direction orthogonal to the first direction. An example of a suitable etch for the dielectric layer 150 is an anisotropic etch comprising a fluorocarbon plasma, e.g., a $CF_4/CHF_3$, $C_4F_8/CH_2F_2$ or $CHF_3/Ar$-containing plasma. It will be appreciated that if the spacers 275 and the dielectric layer 150 are formed of the same material, both materials will be etched when transferring the pattern 300 to the dielectric layer. Advantageously, if the spacers 275 are worn away, the parts 200a of the planarizing, or second mandrel layer 200 that have the same pattern as the upper spacers 275 can function as another layer of hard mask material, thereby allowing the etch of the dielectric layer 150 to be completed. The dielectric layer 150 can be etched through, thereby forming voids 310 that extend to the substrate 160. With reference to FIG. 16B, the substrate 160 is visible in the top view and the lower spacers 175 and temporary layer parts 200a overlie the unetched dielectric material 150a (FIG. 16A) remaining from the dielectric layer 150.

Figure 17A:
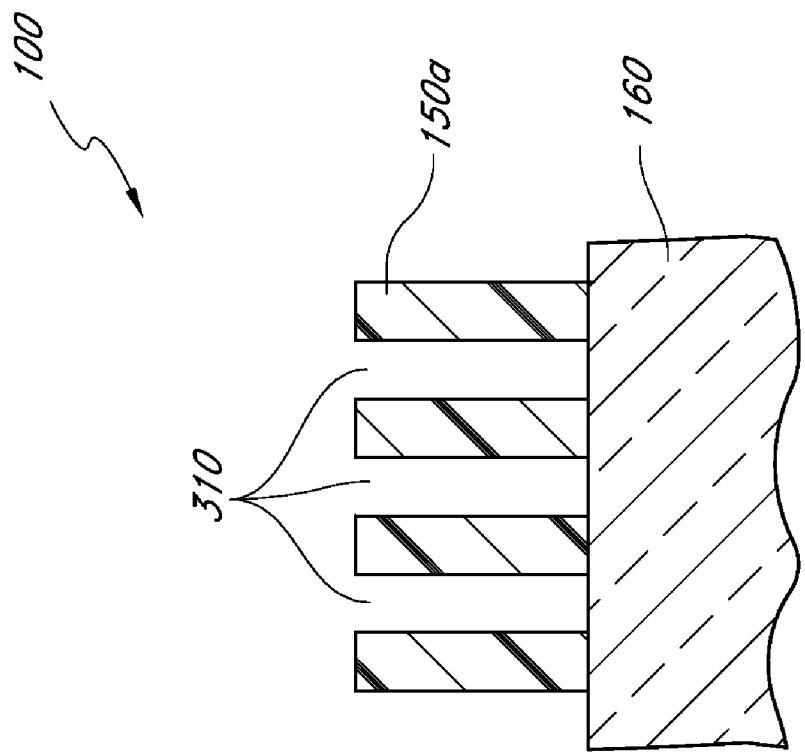
FIGS. 17A and 17B are schematic, cross-sectional side and top plan views of the partially formed integrated circuit of FIGS. 16A-16E after removing the spacers on the first and the second levels, in accordance with preferred embodiments of the invention.
Figure 17B:
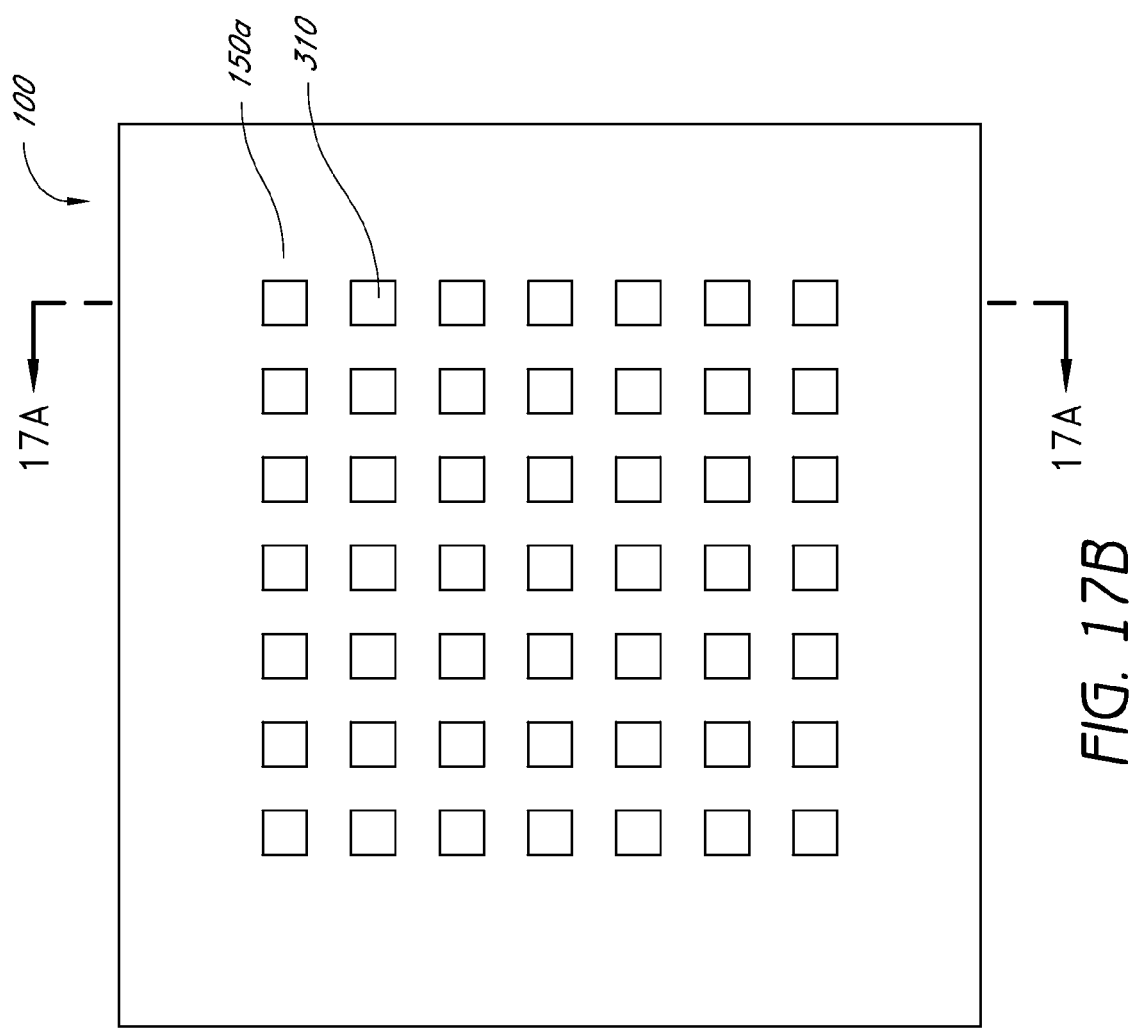

With reference to FIGS. 17A and 17B, the spacers 175 and parts 200a can be removed. For example, the spacers 175 can be removed using an anisotropic etch comprising, e.g., a $HBr/Cl_2$-containing plasma, and the parts 200a can be removed using an anisotropic etch comprising an $O_2$-containing plasma, e.g., a $SO_2/O_2/Ar$, $Cl_2/O_2/SiCl_4$, $SiCl_4/O_2/N_2$ or $HBr/O_2/N_2/SiCl_4$-containing plasma.

Figure 18:
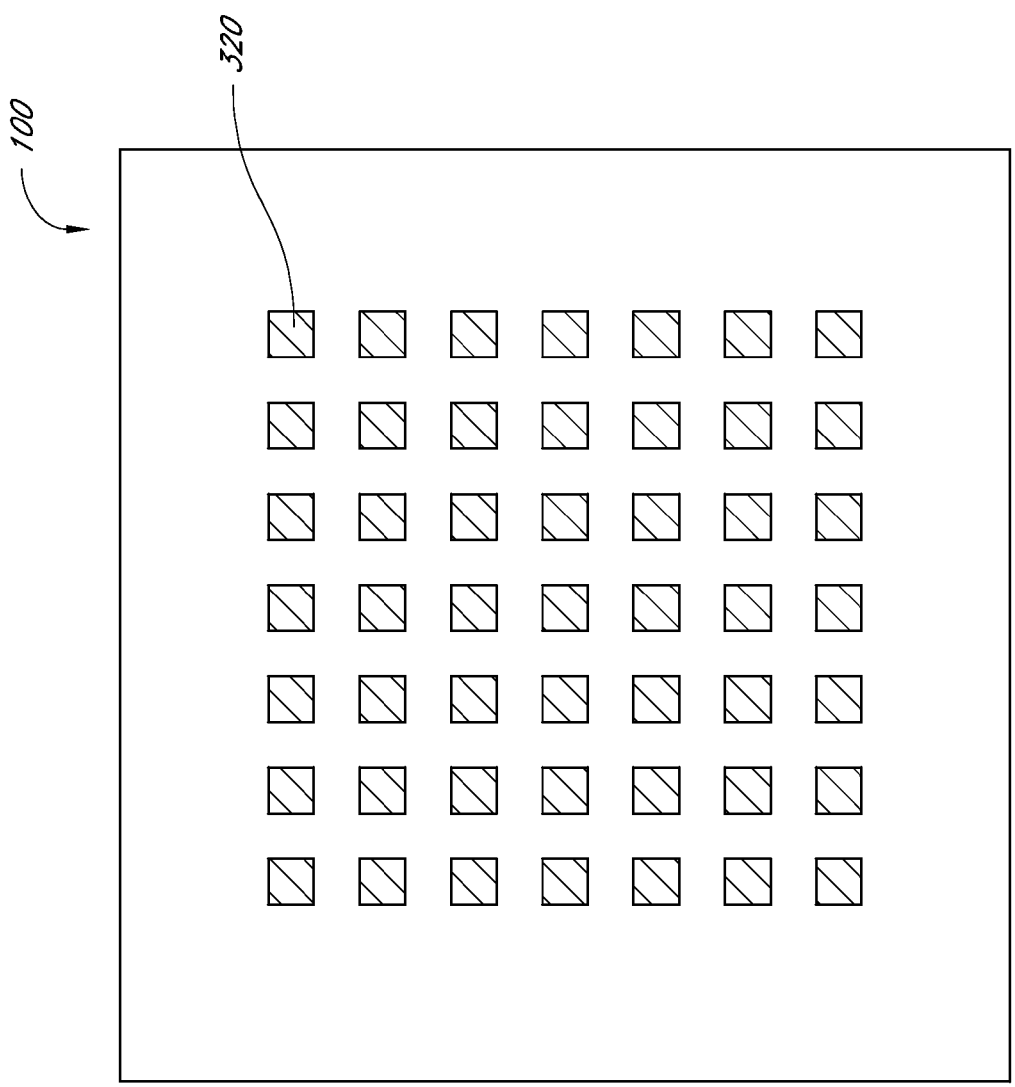
FIG. 18 is a top plan view of the partially formed integrated circuit of FIGS. 17A and 17B after filling voids masked by the spacers on the first and the second levels, in accordance with preferred embodiments of the invention.

With reference to FIG. 18, the voids 310 can be filled with various materials, in various applications where voids, particularly arrays of voids, are desired. In some applications, contacts to various conductive features can be formed by filling the voids with a conductive material. For example, the substrate can comprise conductive interconnect lines, to which the voids 310 open to expose the conductive lines. Conductive plugs 320 can be formed by filling the voids 310 with a conductive material, e.g., a silicide, tungsten, doped polysilicon, titanium, tantalum, nickel and compounds thereof, including metal nitrides, such titanium nitride and titanium nitride tungsten compounds. The voids can be filled by various deposition processes, including, e.g., CVD. Advantageously, a self-directed, selective electrochemical deposition of metal into the voids 310 may also be accomplished by using the exposed conductive lines as a seed layer.

In other non-limiting examples of applications, the voids 310 can be filled with phase change materials, which change conductivity with switchable changes in phase, in a process to form phase change memories or programmable conductor memories (PCRAM); filled with fusable materials (e.g., positively or negatively doped polysilicon or metals) in a process to form programmable read only memories (PROMs); etc. Phase change memories are memories having a material which can be switched between relatively conductive and insulating states by the application of heat. Examplary phase change materials include germanium, antimony and tellurium alloys (also referred to as GeSbT or GST). Programmable conductor RAM (PCRAM) are dendritic memories having a programmable conductor, e.g., chalcogenide glass doped with silver or other high mobility metal, which can be switched between a conductive and nonconductive state by the application of an electric field. For example, the conductors can cause shorts in the glass when an electric field is applied in one direction and can dissolve back into an insulating amorphous glass phase when an opposite electric field is applied. Fusable materials in PROMs can be used as fuses, which are retained or "blown" as desired to establish a desired conductive state in the memory. In other embodiments, electrical devices and/or parts thereof, such as capacitors, may be formed using the voids 310.

It will be appreciated that the formation of patterns according to the preferred embodiments offers numerous advantages. For example, arrays of isolated features, e.g., voids, having widths and lengths of about 15-70 nm, more preferably, about 20-60 nm and, most preferably, about 30-55, can be formed using pitch multiplication.

Moreover, the sizes of the voids can be substantially uniform, or the widths and lengths of the voids can be made to alternate between different sizes, e.g., two or three different sizes, by appropriately selecting the thickness of the spacers and the separation between the mandrels. It will be appreciated that the mandrels 140 (FIG. 9B) and 224 (FIG. 14B) and the separation between the spacers 175 (FIG. 9B) and 275 (FIG. 14B), respectively, determine the widths and/or lengths of columns and rows of voids 310 (FIG. 17B). Thus, by varying the sizes of the mandrels and/or the separation between the spacers 175 and 275, the sizes of the voids 310 can be made to alternate in a regular way. For example, by setting the separation between spacers 175 and 275 at one value and the width of the mandrels 130 and 224 at another value, a pattern of large squares (formed by the intersection of the separations between the spacers), relatively small rectangles (formed by the intersection of the separations between the spacers and the space occupied by the mandrels) and relatively smaller squares (formed by the intersection of the mandrels spaces), can be formed.

In addition, the shape of the opening of the voids can advantageously be varied as desired. For example, squares can be formed by forming uniformly sized and spaced spacers on two levels. In other embodiments, rectangles can be formed by spacing spacers farther apart on one level than the other level. More generally, other parallelograms can be formed by forming the spacers 175 and 275 at an angle other than about 90° relative to one another (the angle as determined from a top down view of the spacers 175 and 275). Moreover, openings of other shapes can be formed by using more than two levels of spacers. For example, by forming two additional levels of spacers, each forming an angle of about 45° relative to existing spacers, octagon-shaped voids can be formed.

It will also be appreciated that various modifications of the illustrated embodiments are possible. For example, while two levels of spacers are illustrated for ease of description, more than two levels of spacers can be formed, as noted above. Moreover, while the dielectric layer 150 is illustrated as a single layer of a single material for ease of illustration and description, the dielectric layer 150 can comprise multiple stratified materials and/or different materials embedded within one or more levels of material(s). In such cases, if necessary, multiple etches may be utilized to etch through the various layers. In some embodiments, to facilitate the etch of the layer 150, the pattern formed by the spacers 175 and 275 can be transferred to another hard mask layer which has a high etch selectivity relative to the material(s) of the layer 150. Such a hard mask layer can comprise, e.g., amorphous carbon, which as a high etch selectivity relative to many of the materials discussed herein. In addition, while formed of a dielectric in the illustrated embodiment, the layer 150 can comprise other materials, which may be insulating and/or conducting, or the mask may be formed directly on the substrate 160.

The layer 150 can also be etched through the open spaces between the overlapping spacers 175 and 275 or the material exposed by the open spaces can be retained and the material underlying the spacers 175 and 275 can be selectively removed to form a pattern of pillars. For example, an inverse mask pattern to that of FIG. 15B can be formed by depositing a material into the open spaces and etching back (e.g., by CMP), and the spacers 175 and 275 and the temporary layer material 200a can be removed to leave a pattern of mask pillars for etching the layer 150. In other embodiments, a material underlying the spacers 175 and 275 can be selectively converted to another material (e.g., by cross-linking or photo-developing) through the open spaces and the unconverted material can be removed to form a pattern of pillars. In some embodiments, the pillars can be the final structures and in other embodiments, these pillars can comprise a hard mask material for etching an underlying material, such as the layer 150.

Figure 16E:
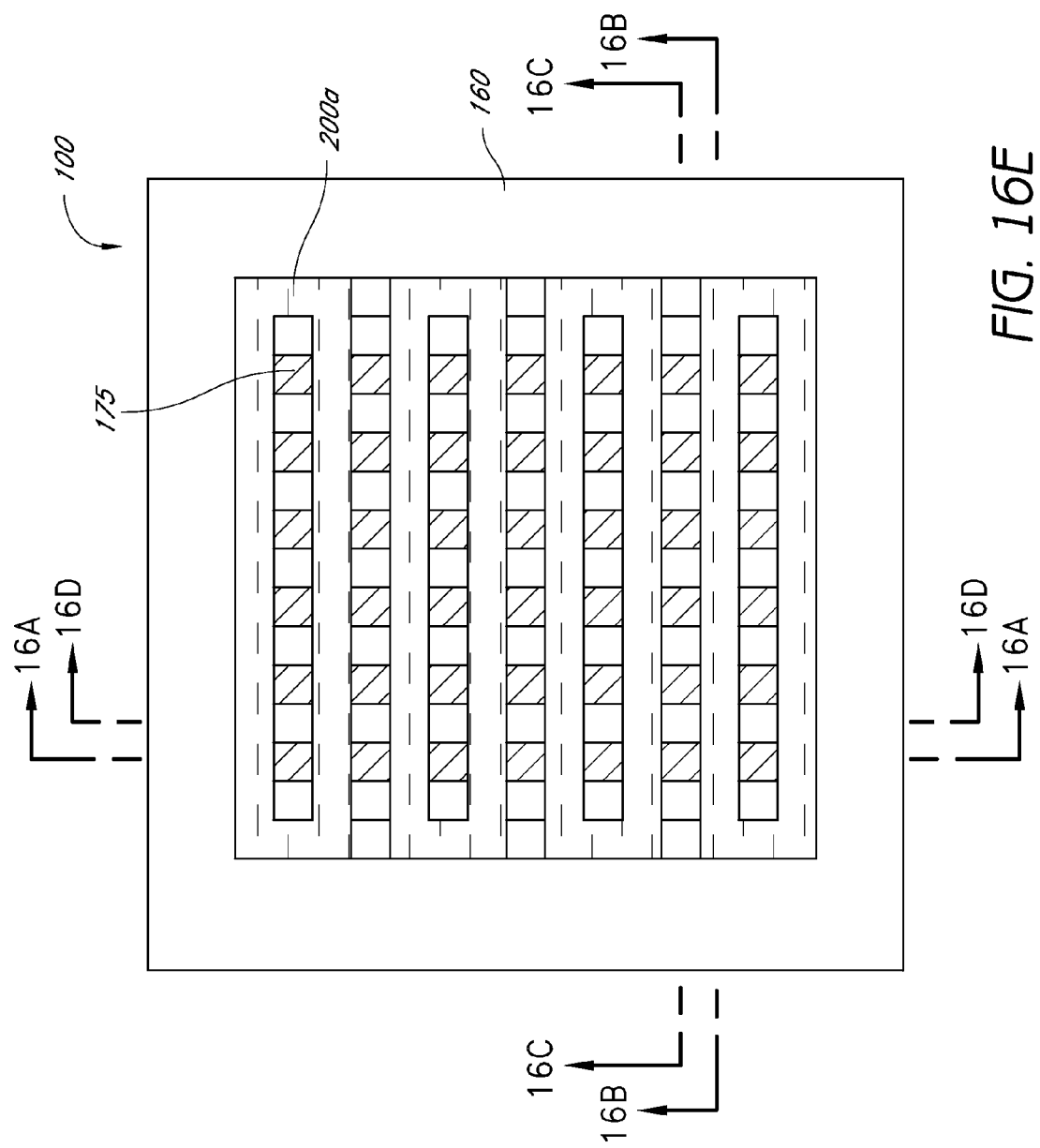
FIG. 16E is a top plan view of the partially formed integrated circuit of FIGS. 15A-15C after transferring a pattern formed by the combination of the spacers on the first and the second levels to an underlying layer, in accordance with preferred embodiments of the invention.

It will be appreciated that pitch multiplied patterns typically form closed loops, since the patterns are formed by spacers that are formed along the wall of a mandrel, e.g., around the exterior of a free-standing mandrel or in the interior of a cavity, along the walls of mandrels delimiting the cavity. Preferably, the dimensions and placement of the spacers on the various levels are chosen such that the ends of the closed loops overlap the peripheral spacers (e.g., the first or the last) of an overlying or underlying set of spacers, as shown in FIGS. 15C and 16E. Thus, a pattern of regularly spaced and dimensioned spacers can be formed. In other embodiments, the ends of the spacer loops may be formed protruding beyond the peripheral spacers. In such cases, additional processing steps can be used to cut off the ends of these loops, so that each loop forms two individual, non-connected lines. This can be accomplished, for example, by forming a protective mask around the parts of the lines to be maintained, while etching away the unprotected ends of the masks. A suitable method for cutting off the ends of the loops is disclosed in U.S. patent application Ser. No. 10/931,771 to Tran et al., filed Aug. 31, 2004, the entire disclosure of which is incorporated be reference herein.

It will also be appreciated that the spacers 175 and 275 can be more than pitch doubled. For example, the spacers 175 can be further pitch multiplied by forming spacers around the spacers 175, then removing the spacers 175, then forming spacers around the spacers that were formerly around the spacers 175, and so on. In this case, the width of the spacers 175, rather than the width of the mandrels 124b determine one of the dimensions of isolated features that may be formed using the spacer pattern. An exemplary method for further pitch multiplication is discussed in U.S. Pat. No. 5,328,810 to Lowrey et al.

In addition, the preferred embodiments can be employed multiple times throughout an integrated circuit fabrication process to form pitch multiplied features in a plurality of layers or vertical levels, which may be vertically contiguous or non-contiguous and vertically separated. In such cases, each of the individual levels to be patterned would constitute a dielectric layer 150 and the various layers 120-260 can be formed over the individual level to be patterned.

Also, while processing through the various mask layers preferably involves etching an underlying layer, processing through the mask layers can involve subjecting layers underlying the mask layers to any semiconductor fabrication process. For example, processing through the resultant mask can involve ion implantation, diffusion doping, depositing, or wet etching, etc. through the mask layers and onto underlying layers. In addition, the mask layers can be used as a stop or barrier for chemical mechanical polishing (CMP) or CMP can be performed on any of the layers to allow for both planarization and etching of the underlying layers, as discussed in U.S. Provisional Patent Application No. 60/666,031, filed Mar. 28, 2005, the entire disclosure of which is incorporated by reference herein.

Accordingly, it will be appreciated by those skilled in the art that various other omissions, additions and modifications may be made to the methods and structures described above without departing from the scope of the invention. All such modifications and changes are intended to fall within the scope of the invention, as defined by the appended claims.

I claim:

1. A mask pattern overlying a partially fabricated integrated circuit, comprising:
   a first plurality of mandrels on a first level;
   a first plurality of spacers disposed at sides of mandrels of the first plurality of mandrels;
   a second plurality of mandrels on a second level above the first level, wherein each mandrel of the second plurality of mandrels contacts multiple mandrels of the first plurality of mandrels; and
   a second plurality of elongated spacers disposed at sides of mandrels of the second plurality of mandrels.

2. The mask pattern of claim 1, wherein the first and the second plurality of mandrels are formed of a same mandrel material.

3. The mask pattern of claim 2, wherein the mandrel material is a reflowable material.

4. The mask pattern of claim 2, wherein the first and the second plurality of spacers are formed of different spacer materials.

5. The mask pattern of claim 1, wherein mandrels of the first plurality of mandrels have widths of about 70 nm or less.

6. The mask pattern of claim 1, wherein mandrels of the second plurality of mandrels have widths of about 70 nm or less.

7. The mask pattern of claim 1, further comprising an intermediate hard mask layer disposed between the first level and the partially fabricated integrated circuit.

8. The mask pattern of claim 7, wherein the intermediate hard mask layer comprises amorphous carbon.

9. The mask pattern of claim 1, wherein the partially fabricated integrated circuit is a partially fabricated memory device.

10. A mask pattern overlying a partially fabricated integrated circuit, comprising:
    a first plurality of elongated spacers on a first level; and
    a second plurality of elongated spacers on a second level, wherein spacers of first plurality of spacers and spacers of the second plurality of spacers extend at an angle of about 30-90° relative to one another.

11. The mask pattern of claim 10, wherein each of the spacers is a closed loop.

12. The mask pattern of claim 10, further comprising a dielectric layer underlying the first and the second levels.

13. The mask pattern of claim 12, wherein the dielectric layer comprises voids, the voids aligning with openings delimited by spacer material on each of the first and the second levels.

14. The mask pattern of claim 12, wherein the angle is about 90°.

15. The mask pattern of claim 10, wherein spacers of the first plurality of elongated spacers are enclosed within a planarization layer, wherein spacers of the second plurality of elongated spacers sit on a surface of the planarization layer.

16. The mask pattern of claim 15, wherein the planarization layer comprises amorphous carbon.

17. The mask pattern of claim 16, wherein spacers of the first plurality of elongated spacers comprises silicon.

18. The mask pattern of claim 17, wherein spacers of the second plurality of elongated spacers comprises an oxide.

19. The mask pattern of claim 10, wherein spacers of the first and the second plurality of spacers have sub-lithographic widths.

20. The mask pattern of claim 10, wherein spacers of the first and the second plurality of spacers have widths of about 20-80 nm.

21. The mask pattern of claim 10, wherein spacers of the first and the second plurality of spacers are pitch-multiplied.

22. The mask pattern of claim 10, wherein spacers of the first plurality of spacers are substantially parallel.

23. The mask pattern of claim 22, wherein spacers of the second plurality of spacers are substantially parallel.

24. The mask pattern of claim 23, wherein spacers of the second plurality of spacers are substantially uniformly spaced.

25. The mask pattern of claim 22, wherein spacers of the first plurality of spacers are substantially uniformly spaced.

* * * * *